United States Patent
Shin et al.

(10) Patent No.: US 6,385,020 B1
(45) Date of Patent: May 7, 2002

(54) METHODS OF FORMING HSG CAPACITORS FROM NONUNIFORMLY DOPED AMORPHOUS SILICON LAYERS AND HSG CAPACITORS FORMED THEREBY

(75) Inventors: Hyun-bo Shin; Myeong-cheol Kim, both of Kyungki-do; Jin-won Kim, Seoul; Ki-hyun Hwang, Kyungki-do; Jae-young Park, Kyungki-do; Bon-young Koo, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/487,740

(22) Filed: Jan. 19, 2000

(30) Foreign Application Priority Data

| Jan. 20, 1999 | (KR) | 99-1654 |
| Apr. 7, 1999 | (KR) | 99-12038 |
| Oct. 13, 1999 | (KR) | 99-44301 |

(51) Int. Cl.⁷ .............................................. H02H 7/00
(52) U.S. Cl. ........................................ 361/15; 361/115
(58) Field of Search ............................ 361/15, 115, 18, 361/113

(56) References Cited

U.S. PATENT DOCUMENTS

| 4,636,833 A | 1/1987 | Nishioka et al. ............... 357/71 |
| 5,102,820 A | 4/1992 | Chiba ........................... 437/52 |
| 5,142,438 A | 8/1992 | Reinberg ..................... 361/313 |
| 5,208,479 A | 5/1993 | Mathews et al. ........... 257/534 |
| 5,227,651 A | 7/1993 | Kim et al. ................... 257/309 |
| 5,234,857 A | 8/1993 | Kim et al. ..................... 437/47 |
| 5,242,536 A | 9/1993 | Schoenborn ................ 156/642 |
| 5,278,091 A | 1/1994 | Fazan et al. .................. 437/60 |
| 5,330,614 A | 7/1994 | Ahn ............................ 156/631 |
| 5,352,623 A | 10/1994 | Kamiyama ................... 437/52 |
| 5,358,888 A | 10/1994 | Ahn et al. ..................... 437/52 |
| 5,362,632 A | 11/1994 | Mathews ...................... 437/47 |
| 5,385,863 A | 1/1995 | Tatsumi et al. ............. 437/109 |
| 5,407,534 A | 4/1995 | Thakur ........................ 156/662 |

(List continued on next page.)

OTHER PUBLICATIONS

Kamiyama et al., Characterization of Ultra–Thin Capacitors Fabricated Using RTN Treatment Prior To CVD $Ta_2O_5$ Film Formation, Extended Abstracts of the 1992 International Conference on Solid State Devices and Materials, Tsukuba, 1992, pp. 521–523.

Watanabe et al., "A New Cylindrical Capacitor Using Hemi–spherical Grained Si (HSG–Si) for 256 Mb DRAMs," IEEE, 1992, pp. 10.1.1–10.1.4.

Primary Examiner—Stephen W. Jackson
(74) Attorney, Agent, or Firm—Myers Bigel Sibley & Sajovec

(57) ABSTRACT

A hemispherical grain (HSG) capacitor having HSGs on at least a part of the surface of capacitor lower electrodes, and a method of forming the same. In the capacitor, lower electrodes are formed of at least two amorphous silicon layers including an amorphous silicon layer doped with a high concentration of impurities and an amorphous silicon layer doped with a low concentration of impurities, and HSGs are formed, wherein the size of the hemispherical grains can be adjusted such that the size of HSGs formed on the inner surface of a U-shaped lower electrode or on the top of a stacked lower electrode is larger than that of HSGs formed on the outer surface of the U-shaped lower electrode or on the sidews of the stacked lower electrode. Thus, bridging between neighboring lower electrodes can be avoided by appropriately adjusting the size of HSGs, resulting in uniform capacitance wafer-to-wafer and within a wafer. The mechanical strength of the U-shaped lower electrode can also be enhanced.

15 Claims, 16 Drawing Sheets

U.S. PATENT DOCUMENTS

| | | | |
|---|---|---|---|
| 5,447,878 A | 9/1995 | Park et al. | 437/52 |
| 5,447,881 A | 9/1995 | Ryou | 437/60 |
| 5,452,178 A | 9/1995 | Emesh et al. | 361/303 |
| 5,459,345 A | 10/1995 | Okudaira et al. | 257/310 |
| 5,486,488 A | 1/1996 | Kamiyama | 437/60 |
| 5,492,850 A | 2/1996 | Ryou | 437/52 |
| 5,554,557 A | 9/1996 | Koh | 437/52 |
| 5,597,754 A | 1/1997 | Lou et al. | 437/52 |
| 5,608,247 A | 3/1997 | Brown | 257/306 |
| 5,612,558 A | 3/1997 | Harshfield | 257/298 |
| 5,618,747 A | 4/1997 | Lou | 438/398 |
| 5,622,889 A | 4/1997 | Yoo et al. | 438/397 |
| 5,623,243 A | 4/1997 | Watanabe et al. | 257/309 |
| 5,629,223 A | 5/1997 | Thakur | 438/398 |
| 5,634,974 A | 6/1997 | Weimer et al. | 117/103 |
| 5,639,685 A | 6/1997 | Zahurak et al. | 437/69 |
| 5,656,531 A | 8/1997 | Thakur et al. | 438/398 |
| 5,658,381 A | 8/1997 | Thakur et al. | 257/309 |
| 5,663,085 A | 9/1997 | Tanigawa | 438/255 |
| 5,663,090 A | 9/1997 | Dennison et al. | 438/398 |
| 5,691,228 A | 11/1997 | Ping et al. | 437/60 |
| 5,696,014 A | 12/1997 | Figura | 437/52 |
| 5,721,153 A | 2/1998 | Kim et al. | 437/60 |
| 5,721,171 A | 2/1998 | Ping et al. | 438/398 |
| 5,726,085 A | 3/1998 | Crenshaw et al. | 438/255 |
| 5,741,734 A | 4/1998 | Lee | 438/235 |
| 5,753,559 A | 5/1998 | Yew et al. | 438/398 |
| 5,759,262 A | 6/1998 | Weimer et al. | 117/88 |
| 5,759,894 A | 6/1998 | Tseng et al. | 438/255 |
| 5,763,306 A | 6/1998 | Tsai | 438/255 |
| 5,798,280 A | 8/1998 | Mathews et al. | 437/165 |
| 5,804,480 A | 9/1998 | Lu et al. | 438/253 |
| 5,811,333 A | 9/1998 | Zenke | 438/255 |
| 5,817,555 A | 10/1998 | Cho | 438/253 |
| 5,821,152 A | 10/1998 | Han et al. | 438/398 |
| 5,837,580 A | 11/1998 | Thakur et al. | 438/255 |
| 5,837,581 A | 11/1998 | Cheng | 438/255 |
| 5,851,875 A | 12/1998 | Ping | 438/253 |
| 5,851,878 A | 12/1998 | Huang | 438/265 |
| 5,872,033 A | 2/1999 | Figura | 438/255 |
| 5,874,336 A | 2/1999 | Cherng | 438/255 |
| 5,885,867 A | 3/1999 | Shin et al. | 438/255 |
| 5,885,869 A | 3/1999 | Turner et al. | 438/261 |
| 5,891,744 A | 4/1999 | Lowrey et al. | 438/14 |
| 5,897,352 A | 4/1999 | Lin et al. | 438/255 |
| 5,899,725 A | 5/1999 | Harshfield | 438/398 |
| 5,913,119 A | 6/1999 | Lin et al. | 438/255 |
| 5,948,703 A | 9/1999 | Shen et al. | 438/714 |
| 5,956,587 A | 9/1999 | Chen et al. | 438/255 |

METHODS OF FORMING HSG CAPACITORS FROM NONUNIFORMLY DOPED AMORPHOUS SILICON LAYERS AND HSG CAPACITORS FORMED THEREBY

RELATED APPLICATION

This application is related to Korean Application Nos. 99-1654, filed Jan. 20, 1999, 99-12038, filed Apr. 7, 1999 and 99-44301, filed Oct. 13, 1999, the disclosures of which are hereby incorporated herein by reference.

FIELD OF THE INVENTION

The present invention relates to methods of forming integrated circuit devices, and more particularly to methods of forming integrated circuit capacitors.

BACKGROUND OF THE INVENTION

The demand for higher capacity semiconductor memory devices has resulted in improved techniques to form memory devices and structures therein at higher levels of integration. However, because higher levels of integration typically require memory devices having smaller unit cell size, the area occupied by a cell capacitor in a memory device, such as a DRAM device, may have to be reduced significantly. As will be understood by those skilled in the art, this reduction in cell capacitor area can degrade memory cell performance if concomitant reductions in cell capacitance also occur.

Conventional methods of increasing cell capacitance include the use of thinner dielectric layers, high dielectric strength material and three-dimensional capacitor electrode structures. Conventional methods of increasing cell capacitor area also include forming cell capacitor electrodes (e.g., storage electrodes) with hemispherical grain (HSG) silicon surface layers. For example, a conventional method of forming HSG silicon surface layers on cell capacitor electrodes is disclosed in U.S. Pat. No. 5,407,534 to Thakur. The basic structure of an HSG capacitor is also disclosed in U.S. Pat. No. 5,597,756 to Fazan et al. However, while capacitors having HSG surface layers therein (hereinafter "HSG capacitors") have manifested enhanced capacitance in high density integrated circuits, HSG capacitors may lack stability and may incur performance degradation over the lifetime of an integrated circuit memory device when formed using conventional methods.

Such conventional methods of forming HSG capacitor electrodes may include the use of amorphous silicon and silane gas as a seed gas, with silicon atom migration taking place in a vacuum atmosphere. Alternatively, impurity doped amorphous silicon layers may be used to form HSGs without requiring seeding. As will be understood by those skilled in the art, the silicon atom migration rate during HSG formation may vary depending on the seeding time, the seed gas flow rate and temperature and pressure. The level of impurity doping concentration in amorphous silicon layers may also determine the size, quantity and rate at which HSGs form from amorphous silicon layers.

Referring now to FIGS. 1–3, conventional methods of forming HSG capacitors will be described. As illustrated by FIG. 1, a conventional method of forming an HSG capacitor may include the steps of forming a plurality of conductive plugs 20 on a substrate containing an electrically insulating layer 10 thereon. A plurality of amorphous silicon patterns 30 may also be formed on respective conductive plugs 20, as illustrated. Conventional HSG formation techniques are used to increase the surface area of the amorphous silicon patterns 30 by forming HSGs thereon. A dielectric layer 40 and upper capacitor electrode 50 are then formed to complete the integrated circuit capacitor structure. As illustrated by FIG. 2, the surface area of each lower capacitor electrode may be increased by forming U-shaped amorphous silicon patterns 32 as three-dimensional electrodes. However, while such U-shaped amorphous silicon patterns 32 may have increased surface area for a given lateral "footprint" or cell size, the formation of HSGs on the outer sidewalls of the U-shaped patterns 32 may increase the likelihood of reliability failures if HSGs on adjacent patterns 32 become electrically connected to each other by silicon "bridges" that may form during the HSG formation steps. In addition, the formation of HSGs typically causes migration of silicon atoms within the U-shaped patterns 32 and such migration, if excessive, may result in an undesirable and nonuniform thinning of the U-shaped patterns 32. Such thinning may make the U-shaped patterns 32 more susceptible to fracture and breakage during subsequent process steps. To address these limitations associated with the capacitors of FIG. 2, steps may taken to mask the outer sidewalls of each U-shaped pattern during HSG formation. Thus, as illustrated by FIG. 3, conventional methods may include the steps of forming HSGs only on the enclosed upper surfaces of the U-shaped patterns 34.

Notwithstanding these conventional techniques, improved methods of forming HSG capacitors are still needed to address limitations associated with conventional methods.

SUMMARY OF THE INVENTION

It is therefore an object of the present invention to provide improved methods of forming integrated circuit capacitors and capacitors formed thereby.

It is another object of the present invention to provide methods of forming integrated circuit capacitors having high capacitance values and capacitors formed thereby.

It is still another object of the present invention to provide methods of forming integrated circuit capacitors having uniform capacitance characteristics across an integrated circuit substrate and capacitors formed thereby.

It is a further object of the present invention to provide methods of forming integrated circuit capacitors having highly uniform capacitance characteristics when reversed and forward biased and capacitors formed thereby.

It is still another object of the present invention to provide methods of forming integrated circuits having capacitors therein with improved long-term reliability.

These and other objects, advantages and features of the present invention are provided by methods of forming integrated circuit capacitors that include the steps of forming a first capacitor electrode (e.g., lower electrode) containing hemispherical grains (HSGs) of silicon from an amorphous silicon layer having a nonuniform doping profile therein. According to a preferred aspect of the present invention, the nonuniform doping profile in the amorphous silicon layer includes a high-to-low doping gradient in a direction extending towards an upper surface thereof. Steps are then performed to form a dielectric layer on the first capacitor electrode and form a second capacitor electrode on the dielectric layer, opposite the first capacitor electrode.

The high-to-low doping gradient in the amorphous silicon layer is preferably achieved by forming the amorphous silicon layer as a composite of a plurality of amorphous silicon layers having different concentrations of dopants therein which may be added using in-situ doping techniques. For example, the first capacitor electrode may be formed by depositing a lower amorphous silicon layer having a relatively high doping concentration therein on a substrate and then depositing an upper amorphous silicon layer having a relatively low doping concentration therein on the lower amorphous silicon layer. Because of the lower doping concentration in the upper amorphous silicon layer (relative to the lower amorphous silicon layer), steps to convert the upper amorphous silicon layer into an HSG layer will result in the formation of an HSG layer with relatively large silicon grains and potentially uneven thickness. However, because silicon atom migration is suppressed in the relatively highly doped amorphous silicon layer, the conversion steps may not contribute significantly to the migration of silicon atoms from the lower more highly doped amorphous silicon layer. Thus, the lower amorphous silicon layer will remain essentially intact during the conversion steps with only relatively small HSGs being formed thereon. More uniform capacitance can therefore be achieved (across a substrate and from wafer-to-wafer) by increasing the uniformity of the thicknesses of the resulting HSG lower capacitor electrodes. Increased reliability can also be achieved by reducing the likelihood of "bridging" between adjacent lower capacitor electrodes on a highly integrated substrate (i.e., between the HSGs on adjacent capacitors). This increased reliability is achieved by forming no HSGs or only relatively small HSGs on those portions of adjacent lower electrodes that are in closest proximity to each other, using preferred doping techniques which inhibit large HSG formation.

According to a preferred embodiment of the present invention, a method of forming an integrated circuit capacitor may comprise the steps of forming a substrate having a conductive plug (e.g., polysilicon plug) therein and forming a first electrically insulating layer on the substrate. The first electrically insulating layer is patterned to have an opening therein that exposes the conductive plug. Steps are also performed to form an amorphous silicon layer in the opening and in contact with the exposed conductive plug. The amorphous silicon layer preferably has a doping profile therein that includes a high-to-low doping gradient in a direction extending towards an upper surface thereof. The upper surface of the amorphous silicon layer is then converted into an HSG layer using HSG formation techniques that may include silicon nucleation and annealing steps. A dielectric layer and an upper capacitor electrode are then formed on the HSG layer.

According to a preferred aspect of this embodiment, the step of forming a dielectric layer is preceded by the step of planarizing the HSG layer to expose the first electrically insulating layer and the converting step comprises annealing the amorphous silicon layer. The planarizing step is also followed by the step of etching the first electrically insulating layer to expose a portion of the annealed amorphous silicon layer that does not contain hemispherical grains of silicon thereon. Alternatively, the converting step may be preceded by the steps of planarizing the amorphous silicon layer to expose the first electrically insulating layer and define a U-shaped amorphous silicon layer, and then etching the electrically insulating layer to expose sidewalls of the U-shaped amorphous silicon layer. Moreover, to achieve even higher capacitance per unit area, the converting step may comprise forming hemispherical grains of silicon on the exposed sidewalls of the U-shaped amorphous silicon layer so that the effective surface area of the first capacitor electrode is increased.

According to a further embodiment of the present invention, preferred HSG capacitors are provided that comprise a U-shaped lower electrode having inner and outer surfaces and hemispherical grains grown thereon. A dielectric film is also deposited on the U-shaped lower electrode and an upper electrode is formed on the dielectric film. According to a preferred aspect of this embodiment, the average size of the hemispherical grains formed on the inner surface of the U-shaped lower electrode may be larger than the average size of the hemispherical grains formed on the outer surface of the U-shaped lower electrode. In addition, an undercut may be formed at the base of the U-shaped lower electrode and the dielectric film and the upper electrode may be formed beneath the base of the lower electrode. Hemispherical grains may also be formed on the base of the lower electrode.

According to still another embodiment, an HSG capacitor is provided comprising a stacked lower electrode having a top surface and sides and hemispherical grains grown on the top surface and sides. A dielectric film is also deposited on the stacked lower electrode and an upper electrode is formed on the dielectric film. Here, the average size of the hemispherical grains formed on the sides of the stacked lower electrode is smaller than the average size of the hemispherical grains formed on the top surface of the stacked lower electrode. According to a further aspect of this embodiment, an undercut may be formed at the base of the U-shaped lower electrode and the dielectric film and the upper electrode may be formed beneath the base of the lower electrode. Hemispherical grains may also be formed on the base of the lower electrode.

BRIEF DESCRIPTION OF THE DRAWINGS

FIGS. 4A, 5–6 and 8A are cross-sectional views of intermediate structures that illustrate additional methods of forming integrated circuit capacitors according to the first embodiment of the present invention.

FIGS. 4A, 5–6 and 9 are cross-sectional views of intermediate structures that illustrate additional methods of forming integrated circuit capacitors according to the first embodiment of the present invention.

FIGS. 4A, 5 and 10 are cross-sectional views of intermediate structures that illustrate methods of forming integrated circuit capacitors according to a second embodiment of the present invention.

FIGS. 4A, 5 and 11 are cross-sectional views of intermediate structures that illustrate additional methods of forming integrated circuit capacitors according to the second embodiment of the present invention.

FIGS. 4A, 5 and 12 are cross-sectional views of intermediate structures that illustrate additional methods of forming integrated circuit capacitors according to the second embodiment of the present invention.

FIGS. 4A and 13 are cross-sectional views of intermediate structures that illustrate methods of forming integrated circuit capacitors according to a third embodiment of the present invention.

FIGS. 4A and 14 are cross-sectional views of intermediate structures that illustrate additional methods of forming integrated circuit capacitors according to a third embodiment of the present invention.

FIGS. 4A and 15 are cross-sectional views of intermediate structures that illustrate additional methods of forming integrated circuit capacitors according to a third embodiment of the present invention.

DESCRIPTION OF PREFERRED EMBODIMENTS

Figure 1:
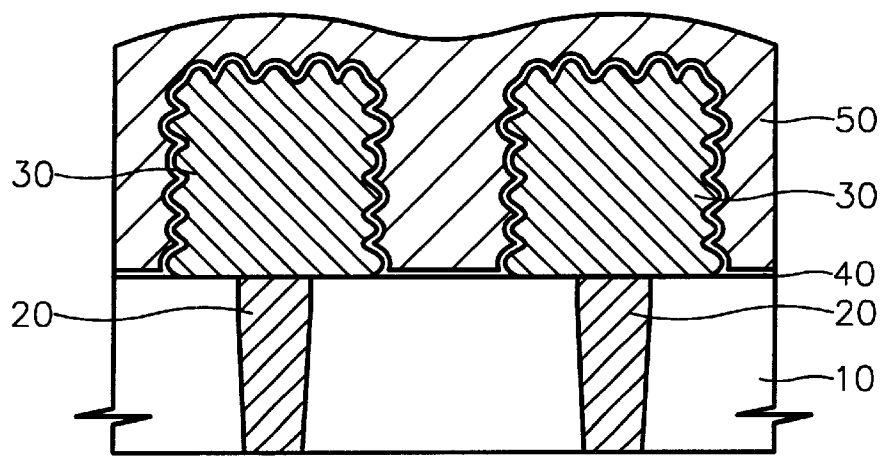
FIGS. 1–3 are cross-sectional views of conventional integrated circuit capacitors having HSG storage electrodes therein.
Figure 2:
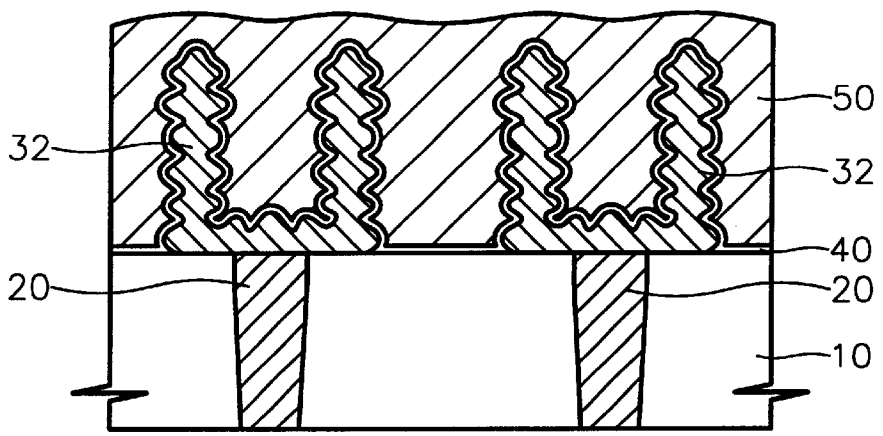
Figure 3:
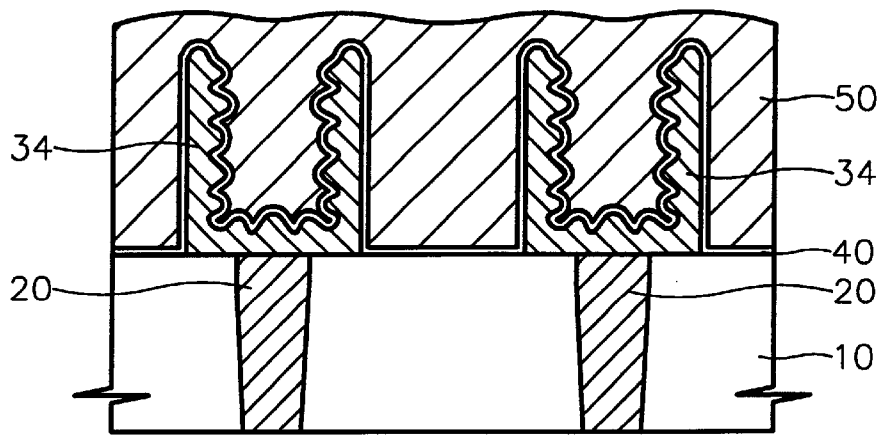

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 4A:
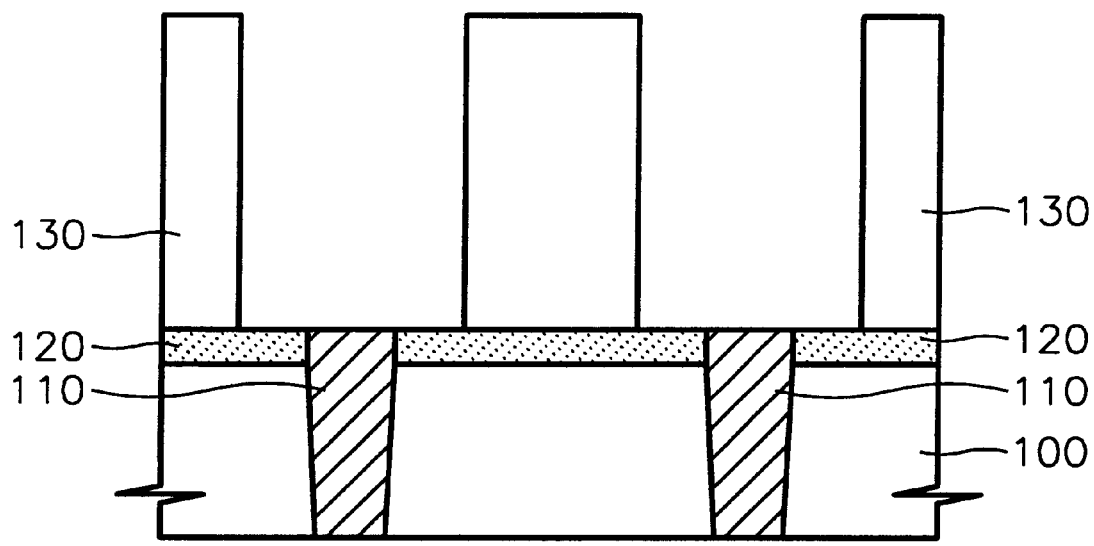
FIGS. 4A and 5–7 are cross-sectional views of intermediate structures that illustrate methods of forming integrated circuit capacitors according to a first embodiment of the present invention.

Referring now to FIGS. 4A and 5–7, a preferred method of forming an integrated circuit capacitor according to a first embodiment of the present invention will be described. In particular, FIG. 4A illustrates the steps of forming a first electrically insulating layer 100 (e.g., oxide layer) on a semiconductor substrate (not shown) and then forming an etch-stop layer 120 (e.g., silicon nitride layer) on the first electrically insulating layer 100. Conventional techniques are then used to form a plurality of contact holes which extend through the etch-stop layer 120 and the first electrically insulating layer 100, and expose portions of the semiconductor substrate (not shown). The exposed portions of the semiconductor substrate may include impurity regions, such as source/drain regions of a memory cell access transistor. The construction of memory cell access transistors that employ an integrated circuit capacitor is more fully described in U.S. Pat. No. 5,780,336 to Son, entitled "Methods of Forming Integrated Circuit Capacitors Having Improved Storage Electrode Contact Regions Therein", assigned to the present assignee, the disclosure of which is hereby incorporated herein by reference.

A blanket layer of an electrically conductive material (e.g., doped polysilicon) is then conformally deposited on the etch-stop layer 120 and in the contact holes. A chemical-mechanical polishing (CMP) step or other conventional etch-back step is then performed to planarize the blanket layer and expose the etch-stop layer 120. As illustrated by FIG. 4A, this planarization step results in the formation of a plurality of conductive contact plugs 110. Next, a second electrically insulating layer 130 (which can be referred to as an interelectrode insulative patter) is formed on the etch-stop layer 120. The second electrically insulating layer 130 may comprise plasma-enhanced tetraethylorthosilicate (PE-TEOS), borophosphosilicate glass (BPSG), phosphosilicate glass (PSG) or undoped silicate glass (USG), for example. A photolithographically defined etching step may then performed to expose the conductive contact plugs 110 and etch-stop layer 120, as illustrated. According to a preferred aspect of the present invention, the etch-stop layer 120 is preferably made of an electrically insulating material (e.g., silicon nitride) that has a high degree of etching selectivity relative to the second electrically insulating layer 130.

Figure 5:
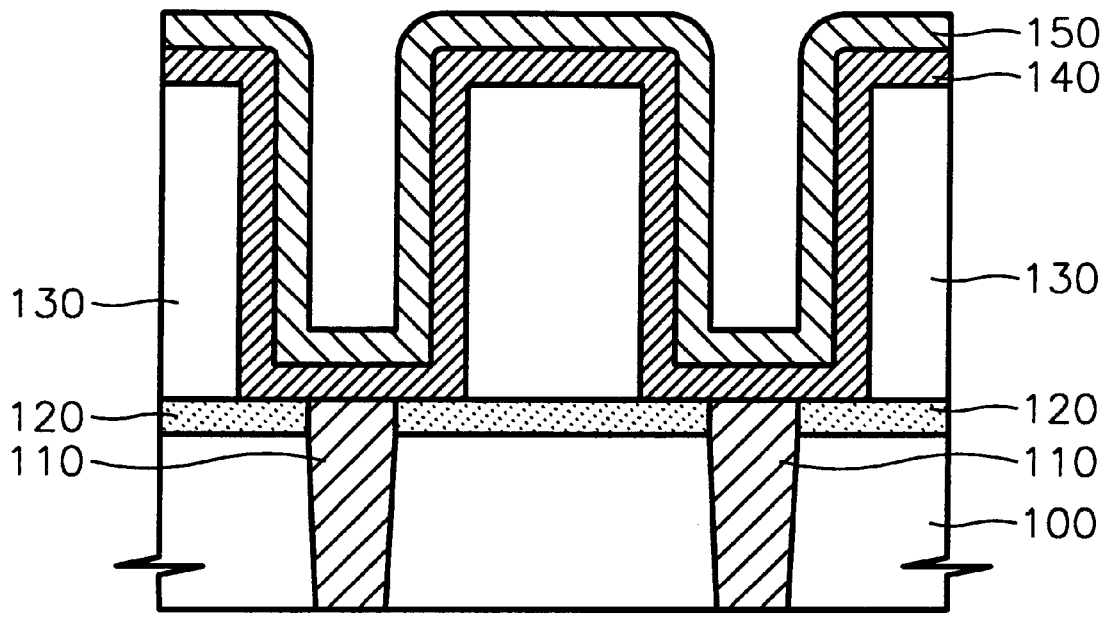

Referring now to FIG. 5, a first layer 140 of amorphous silicon (a-Si) and a second layer 150 of amorphous silicon are then conformally deposited in sequence on the structure of FIG. 4A. These layers 140 and 150 may each have a thickness of about 250 Å. The first layer 140 is preferably doped in-situ with a relatively high concentration of first conductivity type dopants (e.g., N-type (phosphorus)) and the second layer 150 is preferably doped in-situ with a relatively low concentration of first conductivity type dopants. For example, the first conductivity type dopant concentration in the first layer 140 may be at a high end in a range of $5\times10^{19}$ cm$^{-3}$ to $1\times10^{21}$ cm$^{-3}$ (i.e., about 1–20 wt %) by controlling the flow rate of a phosphorus source gas (e.g., PH$_3$) or an arsenic source gas (e.g., AsH$_3$), and the first conductivity type dopant concentration in the second layer 150 may be at a low end in the range of $5\times10^{19}$ cm$^3$ to $4.6\times10^2$cm$^3$. Moreover, although the first amorphous silicon layer 140 and second amorphous silicon layer 150 are shown as distinct layers that may have distinct high and low doping concentrations therein, respectively, they may actually comprise a single layer of amorphous silicon that has a "high-tolow" gradient doping profile therein. This doping profile may be a linear, curvilinear or stair step profile, for example, that is achieved using controlled in-situ and/or ion implantation techniques. Ion implantation techniques may be less preferred in the event the first and second amorphous silicon layers have a non-planar profile as illustrated, however, lower capacitor electrodes that are formed from planar amorphous silicon layers (not shown) may have doping profiles established therein using ion implantation techniques. The selection of the particular doping levels should take into account the silicon atom migration rates, the size of the desired HSG, seeding time and growth temperature and pressure. The thickness of the layers 140 and 150 should also take into account the desired lateral integration density to be achieved and the desired height and width of the lower capacitor electrode ultimately formed.

According to a preferred aspect of the present invention, the establishment of a decreasing doping concentration gradient between the first layer 140 (high) and the second layer 150 (low) can be used advantageously to control the size of hemispherical grains (HSG) of silicon that are formed from the first and second layers during subsequent processing (e.g., annealing). In particular, as determined by the inventors herein, the rate of silicon atom migration during annealing and recrystallization of an amorphous silicon layer is inversely proportional to the concentration of first conductivity type dopants therein. Thus, the rate of silicon atom migration can be reduced in the first layer 140 by using a high concentration of dopants therein. In contrast, the rate of silicon atom migration in the second layer 150 can be maintained at a relatively high level by using a relatively low concentration of dopants therein. This higher level of silicon atom migration in the second layer 150 enhances the rate and increases the size of hemispherical grain formation during annealing. As will be understood by those skilled in the art, the formation of large hemispherical grains of silicon results in an increase in the surface area of an HSG capacitor electrode. Nonetheless, the thickness and structural integrity of the first layer 140 can be maintained by reducing the degree of silicon atom migration therein and therefore reducing the size of hemispherical silicon grains formed therefrom during recrystallization.

Figure 6:
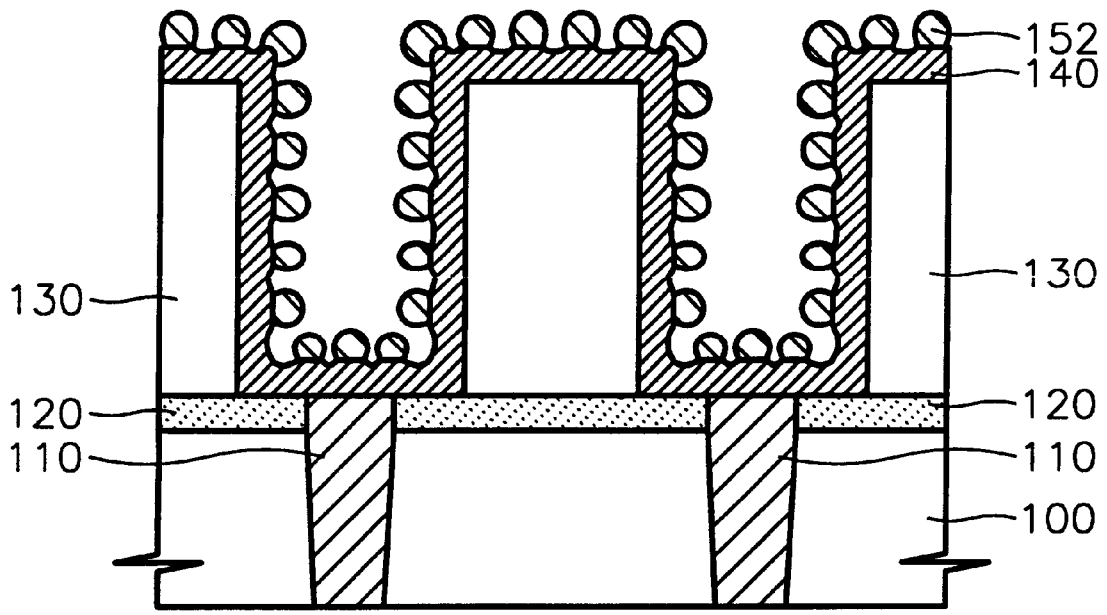

Referring now to FIG. 6, HSGs 152 are formed from the second layer 150 using controlled seeding and atom migration techniques, however, the number of silicon atoms which migrate from the first layer 140 to form grains is limited because of the higher doping concentration in the first layer 140. In particular, using controlled techniques, it is possible to convert all or substantially all of the second layer 150 into an HSG layer 152 while essentially preserving the original thickness of the first layer 140 which acts as a structural support layer. Nonetheless, during formation of the HSGs 152, the first layer 140 may become crystallized. Uniform capacitance across a wafer and from wafer-to-wafer can also be achieved by maintaining the original thickness of the first layer 140 during the HSG formation steps.

Figure 7:
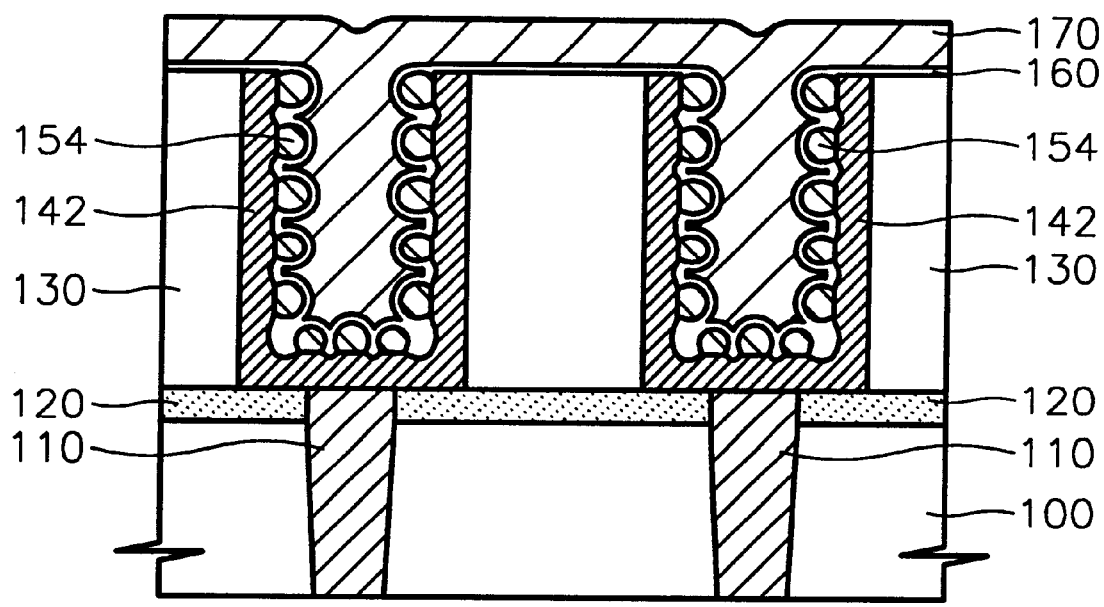

Referring now to FIG. 7, a planarization step is then performed to expose the second electrically insulating layer 130. In particular, a chemical-mechanical polishing (CMP) step or other etch-back step is preferably performed to remove those portions of the HSG layer 152 and first layer 140 that extend opposite the second electrically insulating layer 130. To prevent slurry or etching residues from accumulating on the U-shaped frame layer 142 and overlying HSG silicon layer 154, a layer of photoresist or nitride (not shown) having good step coverage may be deposited on the structure of FIG. 6 before performing the planarization step. This layer of photoresist can then be removed after the planarization step using conventional ashing or stripping techniques, to define a plurality of lower capacitor electrodes that are supported and electrically isolated from each other by the second electrically insulating layer 130. A dielectric layer 160 and an upper capacitor electrode 170 are then formed as illustrated, using conventional techniques.

However, according to another embodiment of the present invention, the effective area of each lower capacitor electrode can be further increased by performing the above-described planarization step and then performing an etching step to remove the portions of the second electrically insulating layer 130 that extend between the outer surfaces of adjacent U-shaped frame layers 142. The dielectric layer 160 and upper capacitor electrode 170 can then be formed to have the shape illustrated by FIG. 8A. In this case, the above-described planarization step may also be preferably preceded by the step of forming an oxide region (instead of a photoresist region) on each of the overlying U-shaped HSG silicon layers 154. These oxide regions may comprise an oxide having good step coverage, such as HSQ (Hydro Silses Quioxane), spin-on-glass (SOG), PE-TEOS, BPSG, PSG and USG (preferably the same material as the second electrically insulating layer 130). These oxide region are then removed simultaneously with the removal of the exposed portions of the second electrically insulating layer 130 after the planarization step.

Figure 4B:
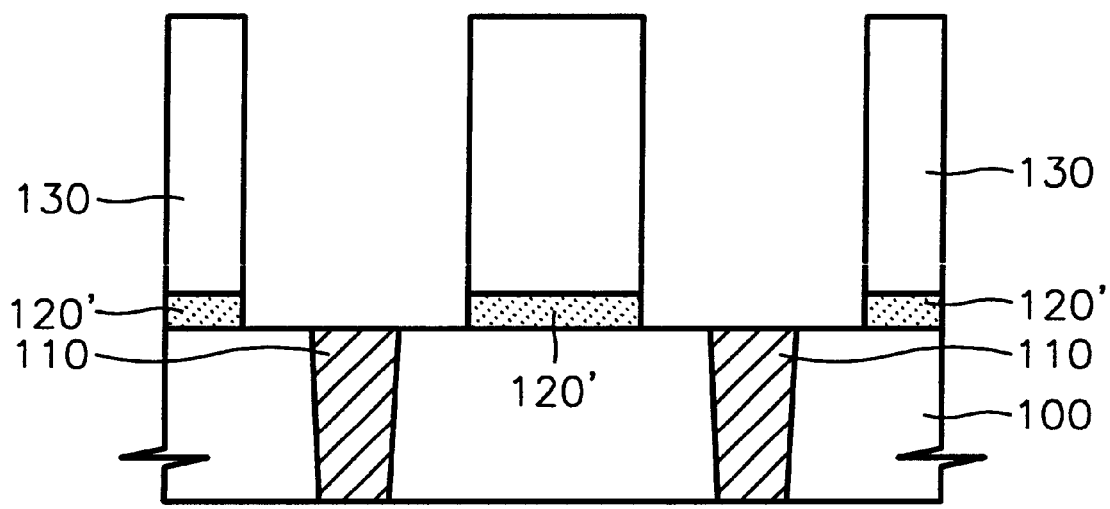
FIGS. 4B and 8B are cross-sectional views of intermediate structures that illustrate additional methods of forming integrated circuit capacitors according to the first embodiment of the present invention.
Figure 8A:
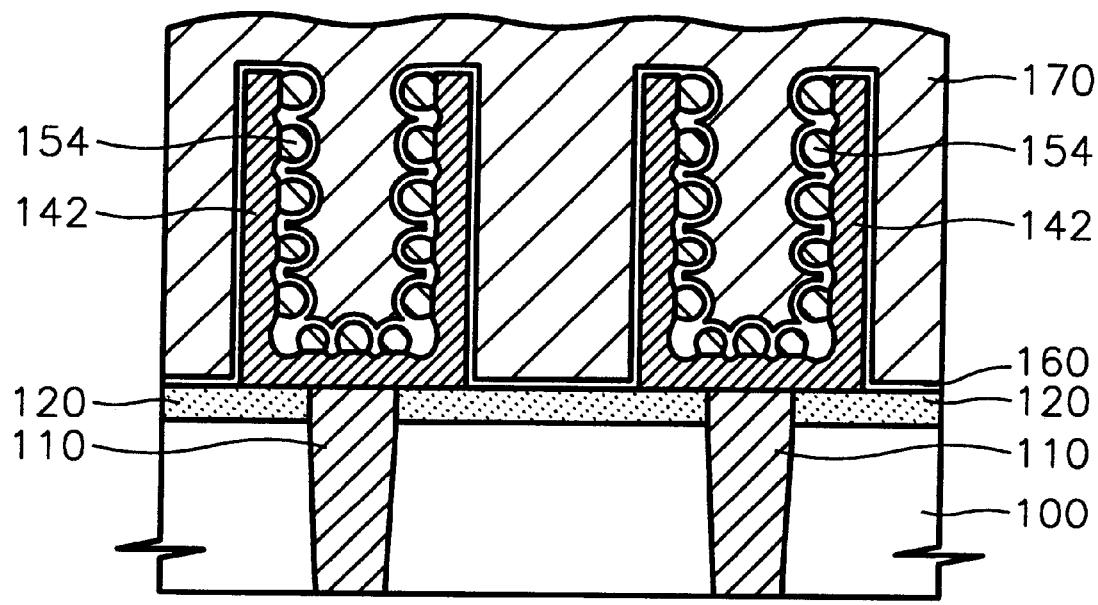
Figure 8B:
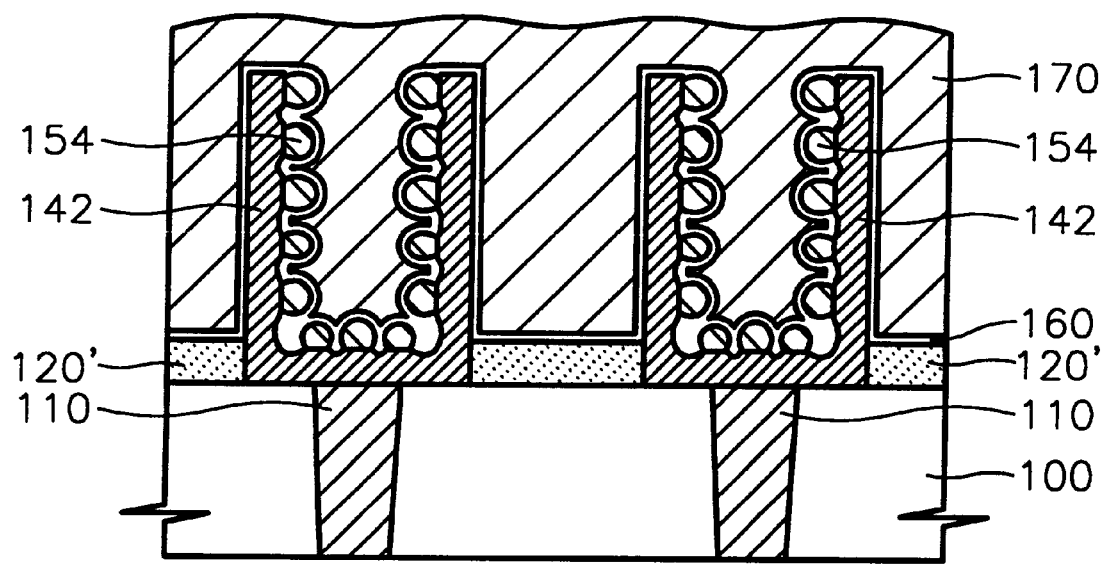

Another aspect of this embodiment may include steps that result in the formation of the structures of FIGS. 4B and 8B. In particular, FIG. 4B illustrates the steps of forming a first electrically insulating layer 100 on a semiconductor substrate (not shown). Conventional techniques are then used to form a plurality of contact holes which extend through the first electrically insulating layer 100, and expose portions of the semiconductor substrate (not shown). A blanket layer of an electrically conductive material (e.g., polysilicon) is then conformally deposited on the first electrically insulating layer 100 and in the contact holes. A chemical-mechanical polishing (CMP) step or other conventional etch-back step is then performed to planarize the blanket layer and expose the first electrically insulating layer 100. This planarization step results in the formation of a plurality of conductive contact plugs 110. Next, an etch-stop layer 120' and a second electrically insulating layer 130 are formed in sequence on the first electrically insulating layer 100. A photolithographically defined etching step may then performed to selectively etch and pattern the second electrically insulating layer 130 and expose the etch-stop layer 120'. Another selective etching step may then be performed to remove the exposed portions of the etch-stop layer 120' and define a patterned etch-stop layer 120', using the patterned second electrically insulating layer 130 as an etching mask. This latter etching step will also cause the conductive contact plugs 110 to become exposed. This patterned etch-stop layer 120' can then be used to provide additional structural support to the U-shaped frame layers 142. The presence of this patterned etch-stop layer 120' will also act to inhibit undercutting of the U-shaped frame layers 142. The steps described above with respect to FIGS. 5–6 and 8A can then be performed to define the structure illustrated by FIG. 8B.

Figure 9:
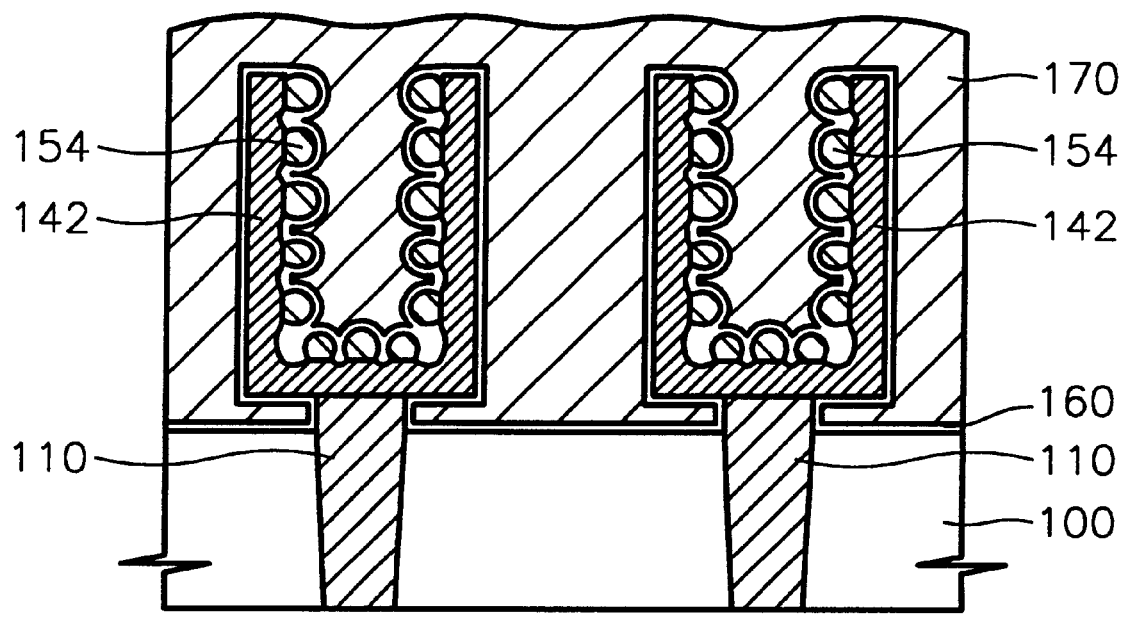

As illustrated best by FIG. 9, after removing the portions of the second electrically insulating layer 130 that extend between the outer surfaces of the adjacent U-shaped frame layers 142 (as described above with respective to FIG. 8A), a selective etching step may be performed to remove the etch-stop layer 120 and thereby expose the underlying first electrically insulating layer 100 and underlying portions of the U-shaped frame layers 142. The dielectric layer 160 and upper capacitor electrode 170 can then be formed to have the shape illustrated by FIG. 9.

Figure 10:
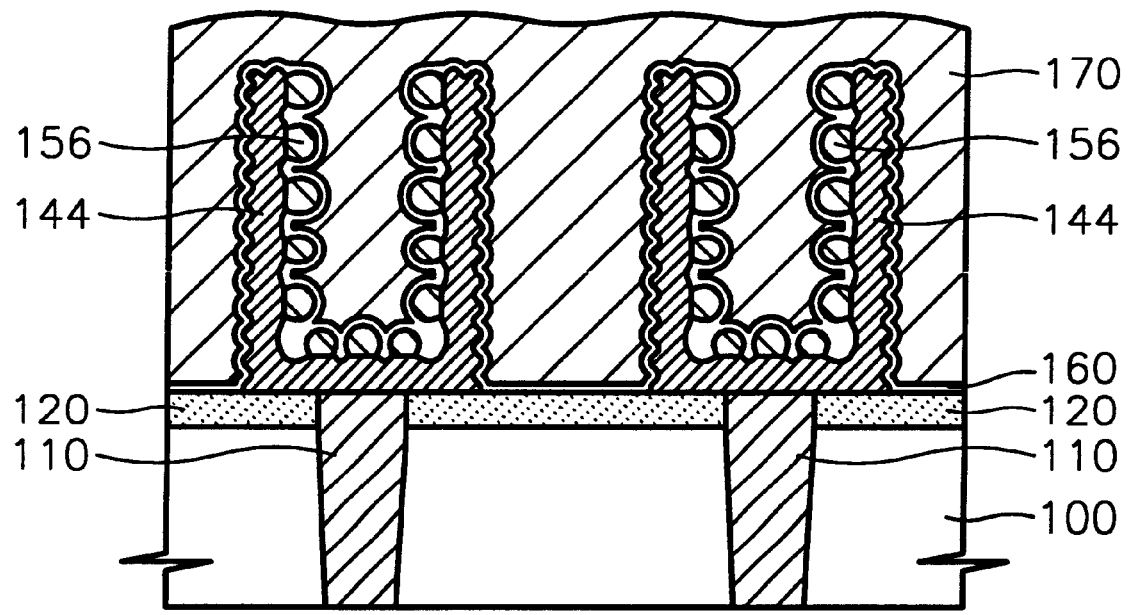

Referring now to the cross-sectional views of FIGS. 10–12, methods of forming integrated circuit capacitors according to a second embodiment of the present invention will be described. In particular, FIG. 10 illustrates integrated circuit capacitors that are similar to the capacitors of FIG. 8A, however, the outer surfaces of the U-shaped frame layers 144 contain relatively small HSGs thereon which increase the effective surface area of each of the lower electrodes. Thus, each lower electrode comprises a primary HSG layer 156 and a U-shaped frame layer 144 having relatively small HSGs thereon. The capacitors of FIG. 10 are formed using the same steps as those illustrated by FIGS. 4A and 5. However, a planarization or etch-back step is then performed on the intermediate structure of FIG. 5 to expose the second electrically insulating layer 130 and pattern the first and second amorphous silicon layers 140 and 150 into separate U-shaped lower electrodes. The exposed portions of the second electrically insulating layer 130 are then removed using steps similar to those described above with respect to FIG. 8A. HSGs are then formed using the techniques described above with respect to FIG. 6. Here, the underlying U-shaped frame layers, that were patterned from the first amorphous silicon layer 140, are crystallized and relatively small HSGs are formed on their outer surfaces. These HSGs are relatively small because the first amorphous silicon layer 140 was formed with a relatively high doping concentration therein that acts to inhibit silicon atom migration and thereby acts to inhibit the formation of large HSGs. Based on these steps, each lower electrode comprises an underlying U-shaped frame layer 144 having relatively small HSGs thereon and an upper U-shaped HSG layer 156. Conventional techniques can then be used to form a dielectric layer 160 and an upper electrode layer 170, as illustrated. In addition, the structure of FIG. 10 may be modified by forming the etch-stop layer 120 after the conductive plugs 110 are formed, as described above with respect to FIGS. 4B and 8B. In this case, the resulting etch-stop layer will provide additional support to the U-shaped frame layer 144.

Figure 11:
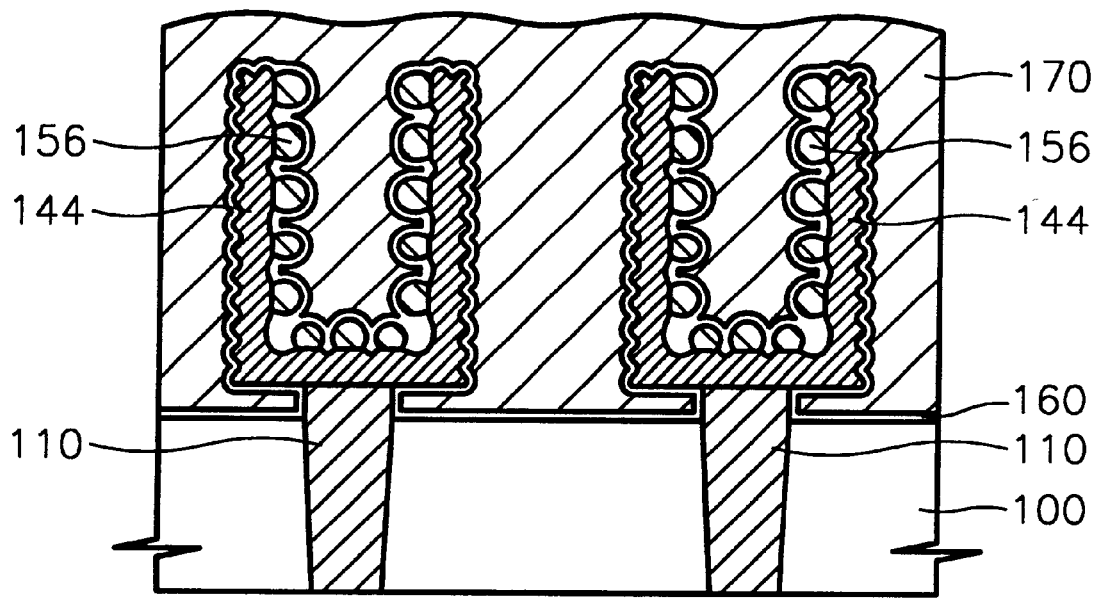
Figure 12:
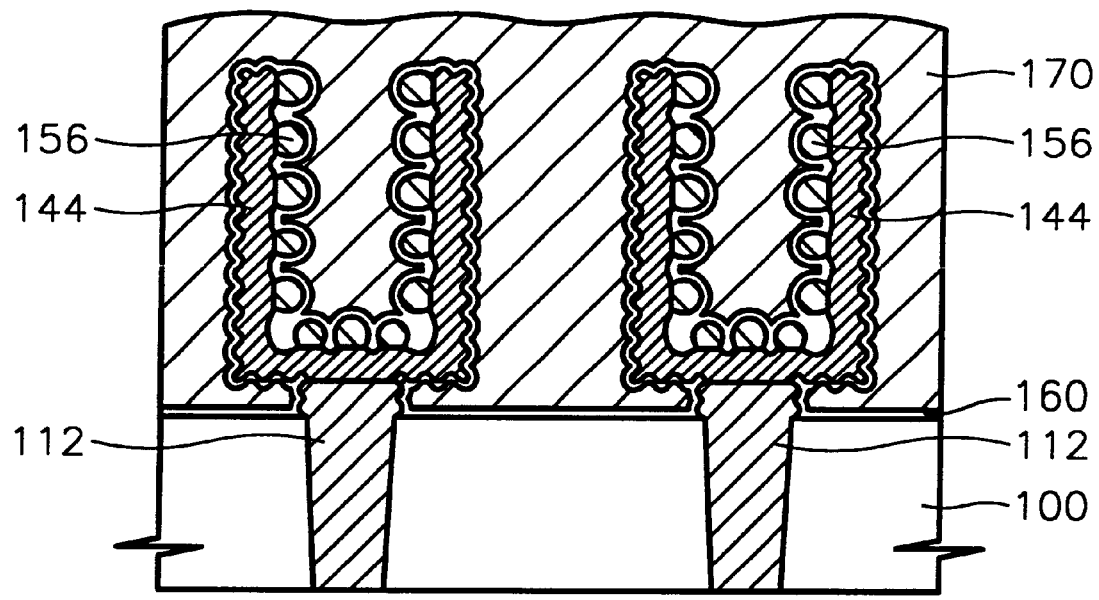

Referring now to FIG. 11, the structure of FIG. 10 may be modified by performing an additional etching step to remove etch-stop layer 120 after the HSGs are formed on the U-shaped frame layer 144. This etching step will result in the exposure of the underlying conductive plugs 110. The dielectric layer 160 and upper electrode layer 170 can then be formed on the exposed portions of the conductive plugs 110 and on underlying surfaces of the U-shaped frame layer 144, as illustrated. Moreover, the structure of FIG. 12 can be achieved by removing the etch-stop layer 120 before performing the steps to form HSGs. In this manner, HSGs can be formed on underlying surfaces of the U-shaped frame layer 144 and on the conductive plugs 110 as well.

Figure 13:
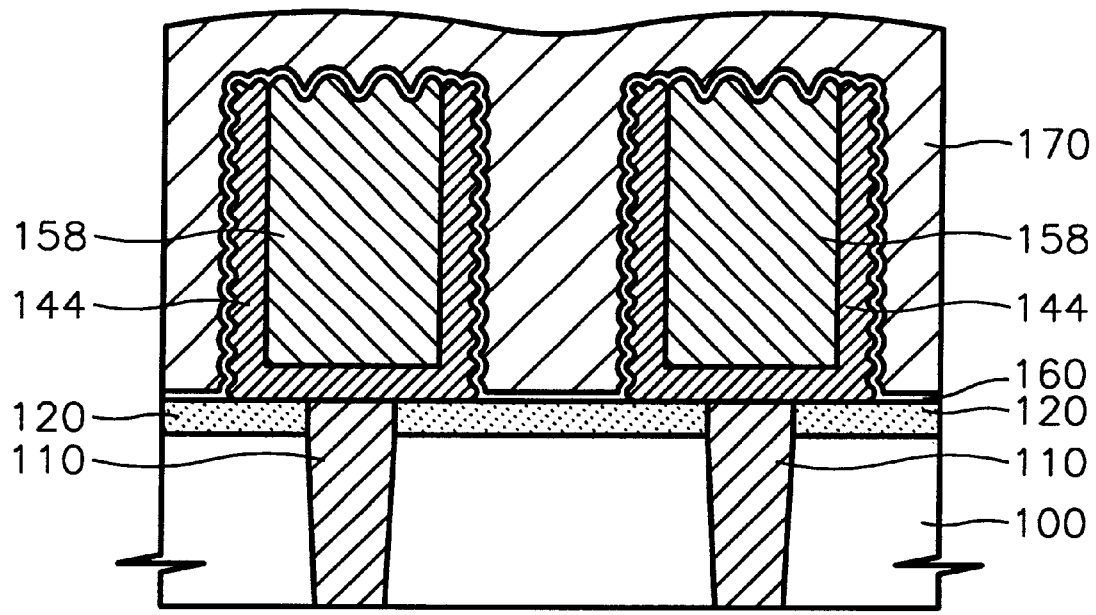
Figure 14:
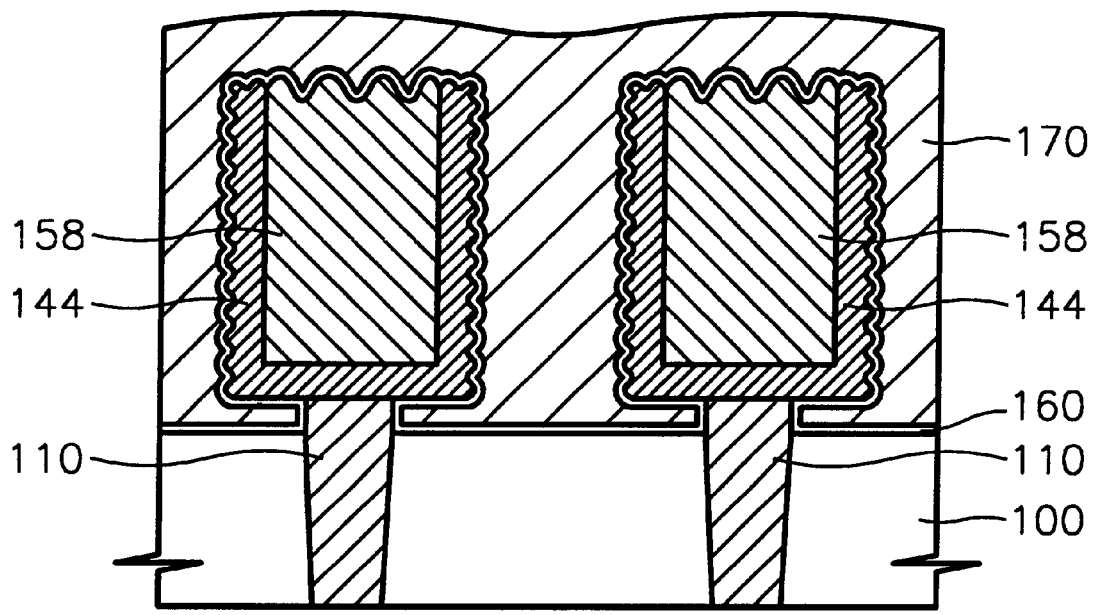
Figure 15:
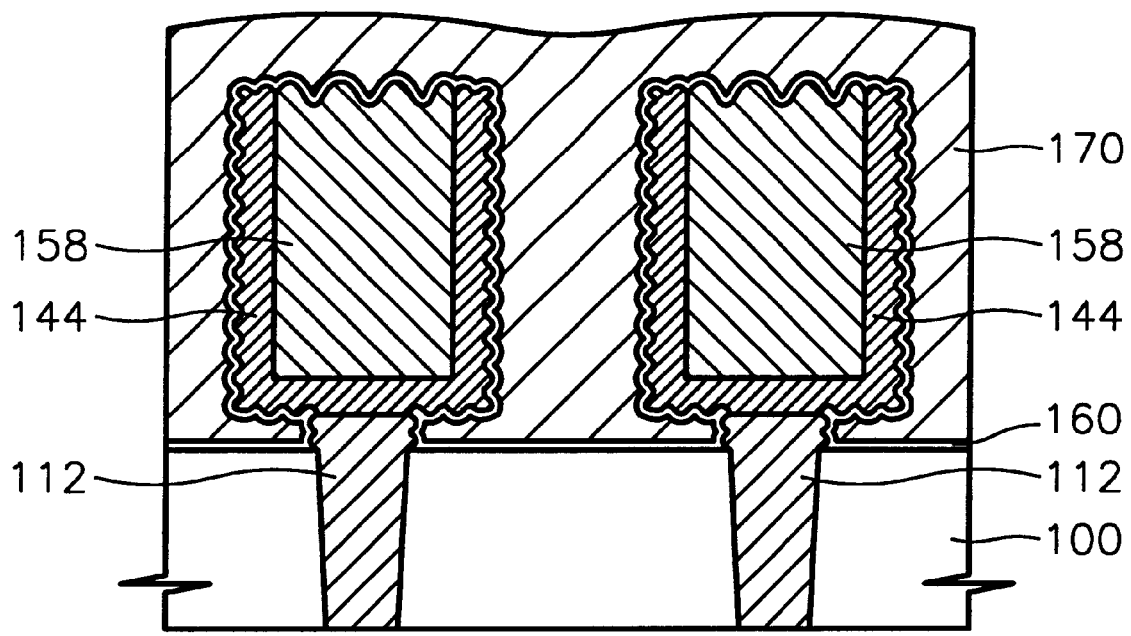

Referring now to the cross-sectional views of FIGS. 13–15, methods of forming integrated circuit capacitors according to a third embodiment of the present invention will be described. In particular, methods according to the third embodiment result in the formation of an integrated circuit capacitor having a box-shaped lower electrode that comprises a relatively highly doped U-shaped frame layer 144 and a more lightly doped box-shaped layer 158 that fills the cavity defined by the frame layer 144. Because of the relative doping concentrations, relatively small HSGs can be formed on the top and outer surfaces of the U-shaped frame layer 144 and relatively large HSGs can be formed on the upper surface of the box-shaped layer 158, as illustrated. In order to form the box-shaped lower electrode of FIG. 13, the steps illustrated by FIG. 5 are modified somewhat. In particular, after the formation of the first amorphous silicon layer 140, a much thicker second amorphous silicon layer is deposited until the U-shaped opening defined by the first amorphous silicon layer 140 is completely filled. The above-described planarization steps are then performed to remove portions of the first and second amorphous silicon layers and expose the second electrically insulating layer 130. The second electrically insulating layer 130 is then selectively etched to expose the etch-stop layer 120. Steps are then performed to define the HSGs on the upper surface of the box-shaped layer 158 and on the outer surfaces of the U-shaped frame layer 144. The above-described steps for forming the dielectric layer 160 and upper electrode layer 170 are then performed. The steps illustrated by FIG. 14 are similar to those of FIG. 13, however, the etch-stop layer 120 is removed after the HSGs are formed. Moreover, the steps illustrated by FIG. 15 are similar to those of FIG. 13, however, the etch-stop layer 120 is removed before the HSGs are formed.

Figure 16A:
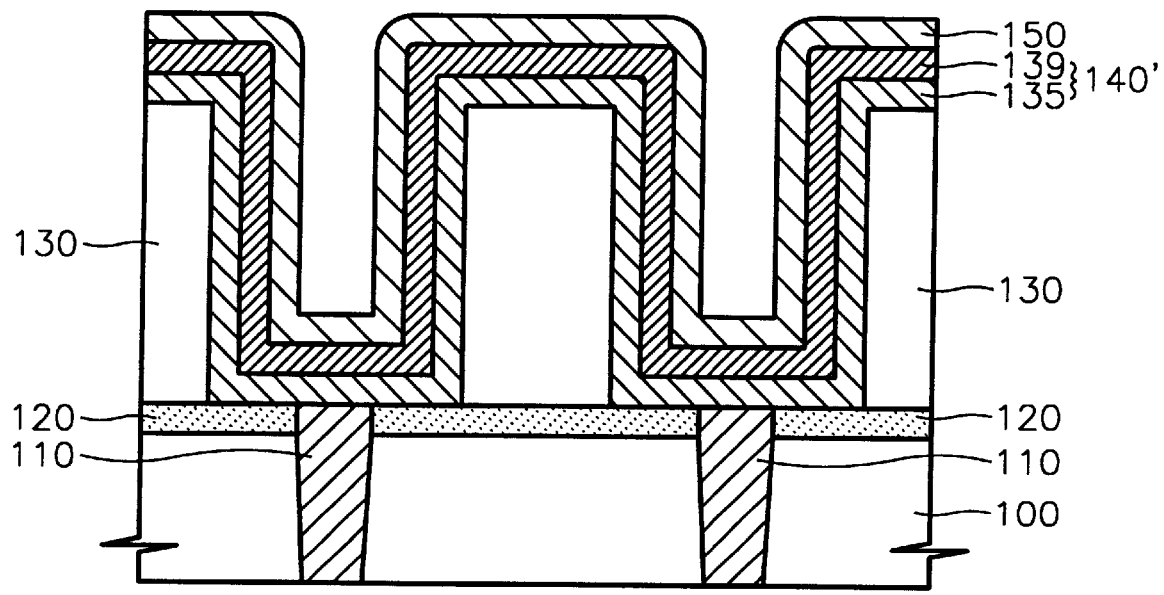
FIGS. 16A–16C are cross-sectional views of intermediate structures that illustrate methods of forming integrated circuit capacitors according to a fourth embodiment of the present invention.
Figure 17:
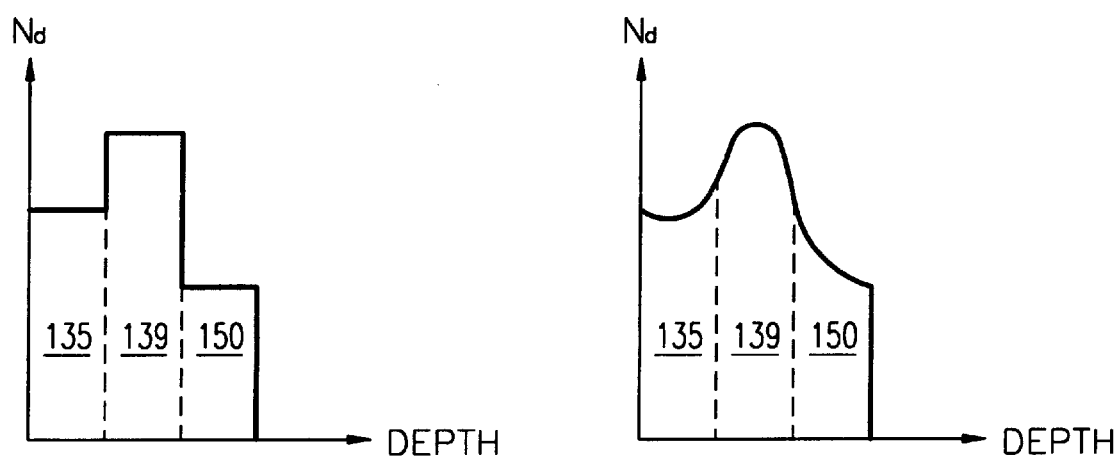
FIG. 17 illustrates graphs of doping concentration versus thickness that correspond to the doping concentrations in the amorphous silicon layers of FIG. 16A.

In each of the above-described embodiments, a composite amorphous silicon layer 140' may be substituted for the first amorphous silicon layer 140 of FIG. 5, as illustrated by FIG. 16A. In particular, the composite amorphous silicon layer 140' may comprise a lower first amorphous silicon layer 135 and an upper first amorphous silicon layer 139. As illustrated by FIG. 17, these lower and upper first amorphous silicon layers 135 and 139 may be doped at distinct levels or a continuous "low-to-high" doping profile may be established between them using in-situ doping techniques. For example, the lower first amorphous silicon layer 135 may be doped at a level which is intermediate the doping levels of the upper first amorphous silicon layer 139 and second amorphous silicon layer 150, so that the resulting lower electrode will have increased surface area on its outer surfaces after formation of the HSGs. The specific doping concentration in the lower first amorphous silicon layer 135 is preferably selected at a level that accounts for the lateral separation distance between adjacent electrodes since shorting between adjacent electrodes may occur if the HSGs formed on the lower first amorphous silicon layer 135 become too large.

Figure 16B:
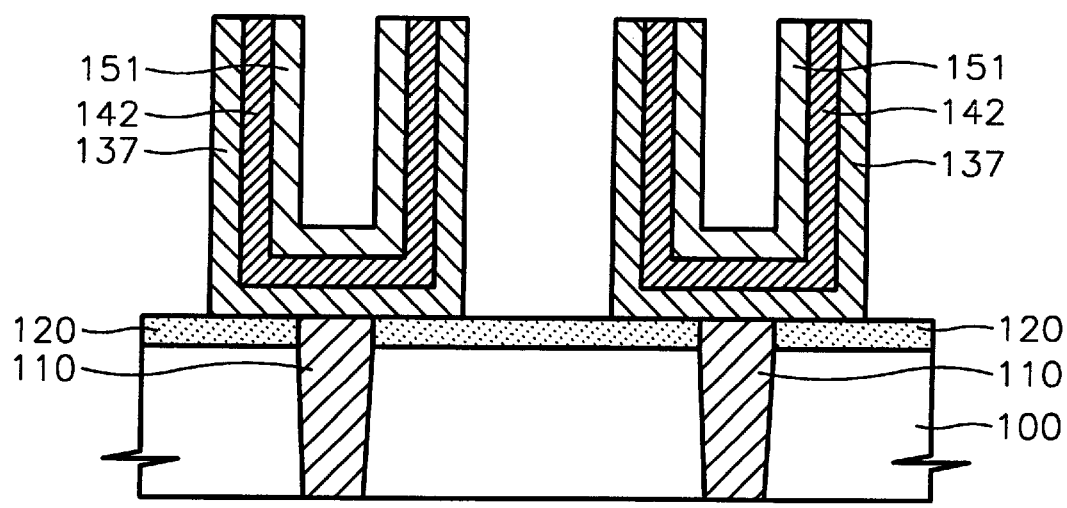
Figure 16C:
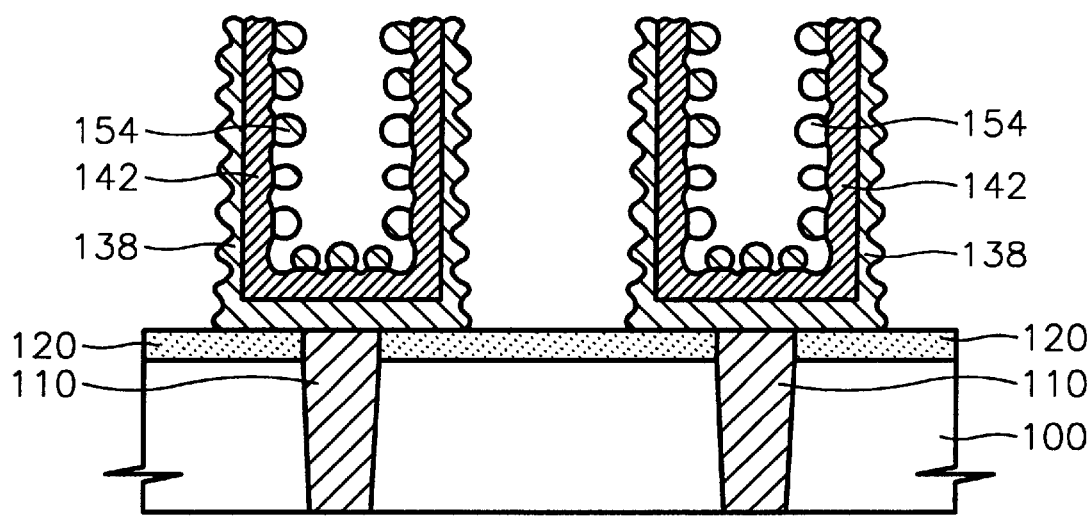

Referring now to FIGS. 16B–16C, the steps described above with respect to FIGS. 5 and 10 may be performed to define a plurality of U-shaped lower storage electrodes which each comprise a lower U-shaped amorphous silicon layer 137, an intermediate U-shaped amorphous silicon layer 142 and an upper U-shaped amorphous silicon layer 151. HSGS may then be formed on these layers with the upper HSG layer 154 having the largest HSGs and the lower HSG layer 138 having intermediate-sized HSGs. These intermediate-sized HSGs can be expected to be larger than those associated with the U-shaped frame layer 144 of FIG. 10 because of the reduced doping level in the lower first amorphous silicon layer 135 of FIG. 16A. As described above, this reduced doping level enhances the degree of silicon atom migration during HSG formation.

Figure 18:
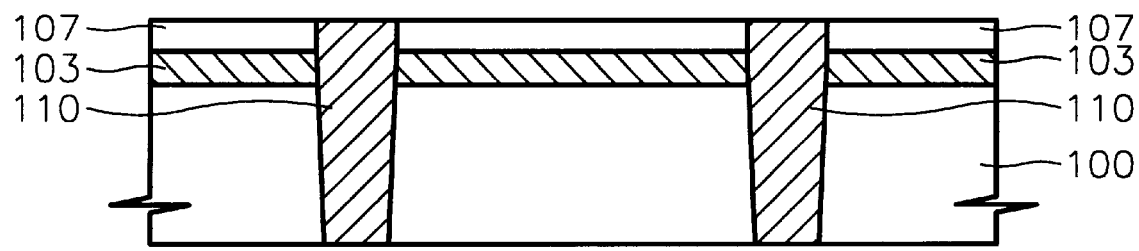
FIGS. 18–21 are cross-sectional views of intermediate structures that illustrate methods of forming integrated circuit capacitors according to a fifth embodiment of the present invention.

Referring now to FIGS. 18–21, preferred methods of forming integrated circuit capacitors according to a fifth embodiment of the present invention will be described. In particular, FIG. 18 illustrates the steps of forming a first conductive layer 103 on a substrate 100. This substrate 100 may comprise an interlayer dielectric layer (shown) on an underlying semiconductor substrate (not shown). The first conductive layer 103 may comprise a doped polysilicon layer. A first electrically insulating layer 107 (e.g., a high temperature oxide (HTO) layer) may then be formed on the first conductive layer 103, using conventional techniques. Photolithographically defined etching steps may then be performed to define a plurality of contact holes that extend through the first electrically insulating layer 107, the first conductive layer 103 and the interlayer dielectric layer, and expose portions of the semiconductor substrate. A blanket layer of an electrically conductive material (e.g., doped polysilicon) may then be deposited on an upper surface of the first electrically insulating layer 107 and in the contact holes. A conventional planarization step (e.g., CMP) may then be performed to remove portions of the blanket layer thereby define a plurality of conductive plugs 110 in the contact holes.

Figure 19:
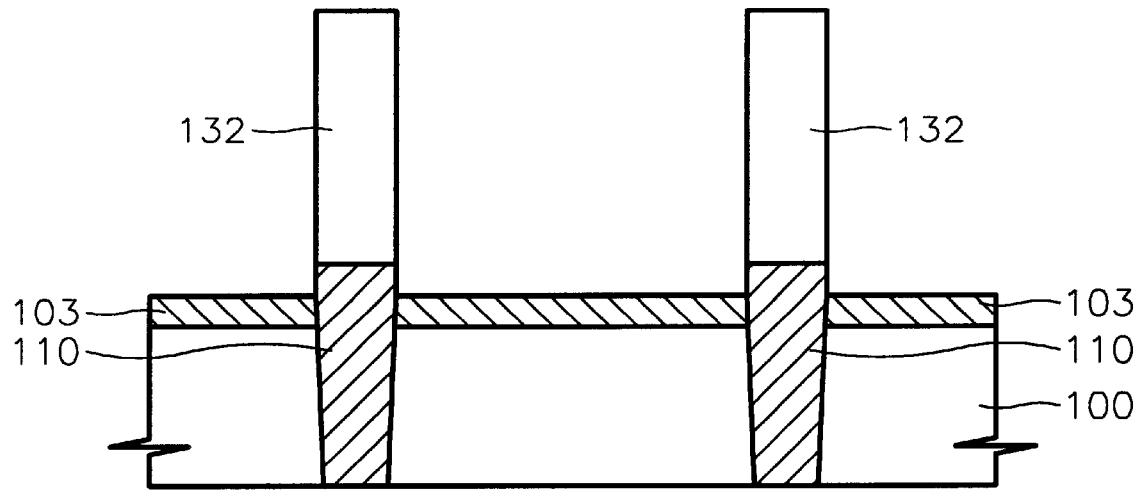

Referring now to FIG. 19, a second interlayer dielectric layer of predetermined thickness may then be deposited on the structure of FIG. 18 and then patterned to define a plurality of structural support layers 132 on the conductive plugs 110. During the steps of forming and then patterning the second interlayer dielectric layer using conventional selective etching techniques, the first electrically insulating layer 107 may be removed. In addition, slight overetching of the first conductive layer 103 may take place and result in the formation of a somewhat thinner conductive layer.

Figure 20:
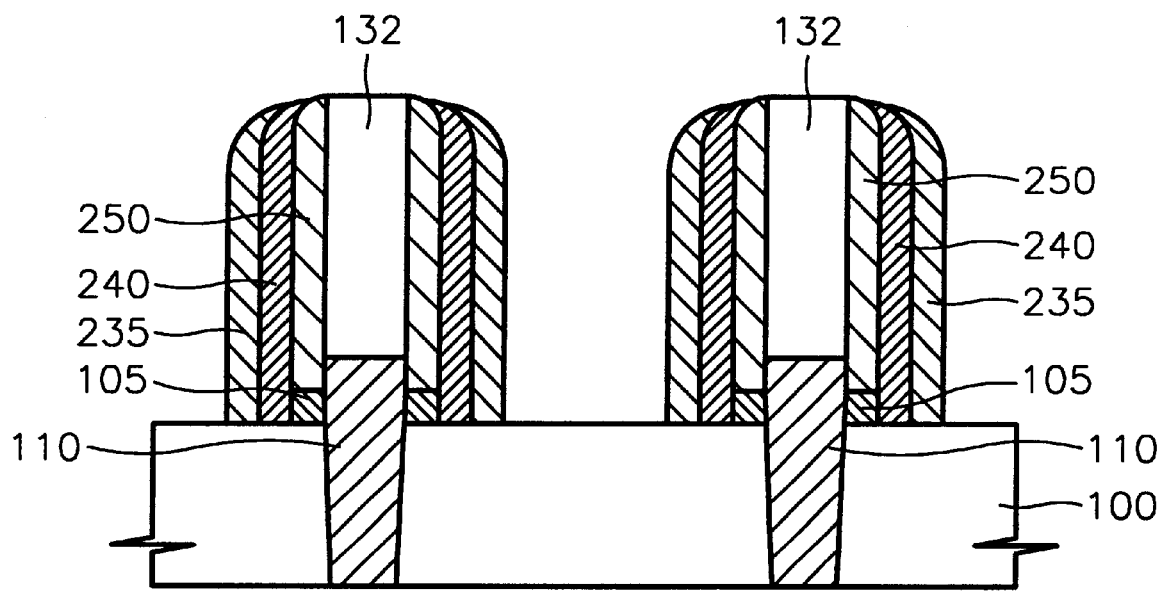
Figure 21:
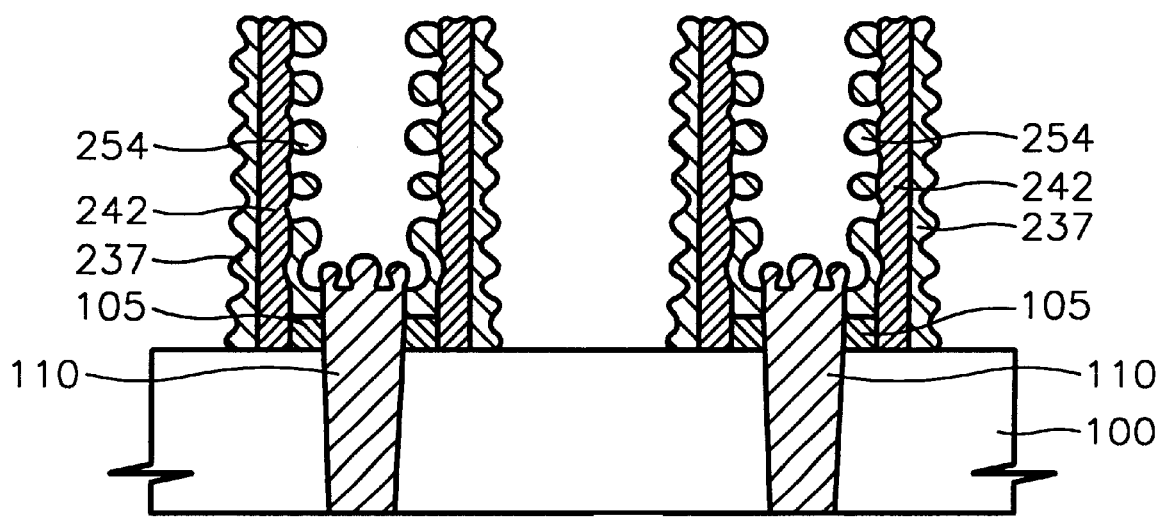

Referring now to FIG. 20, a first amorphous silicon layer is deposited and patterned to define amorphous silicon sidewall spacers 250 on the sidewalls of the structural support layers 132, as illustrated. During this patterning step, exposed portions of the conductive layer 103 may also be removed, with only small polysilicon tabs 105 remaining. Second and third amorphous silicon layers are then deposited and anisotropically etched in sequence to form second and third amorphous silicon layers 240 and 235, respectively. Here, like in FIG. 17, the intermediate second amorphous silicon layer 240 may be more highly doped than the outer third amorphous silicon layer 235, which may be more highly doped than the amorphous silicon sidewall spacers 250. Referring now to FIG. 21, the structural support layers 132 are removed and then steps are performed to grow HSGs on the amorphous silicon layers 235, 240 and 250 and on upper surfaces of the conductive plugs 110. These steps result in the formation of a lower capacitor electrode comprising: an outer layer 237 having HSGs thereon of intermediate size, a support layer 242 having relatively few HSGs thereon of small size (on a top surface) and an inner layer 254 having HSGs thereon that are relatively large. In addition, each lower electrode may comprise a conductive plug 110 with HSGs on an upper surface thereof, as illustrated. The methods according to the fifth embodiment of the present invention are also preferably applicable to the structure having two layers of amorphous silicon as described with respect to FIGS. 8–12.

Figure 22:
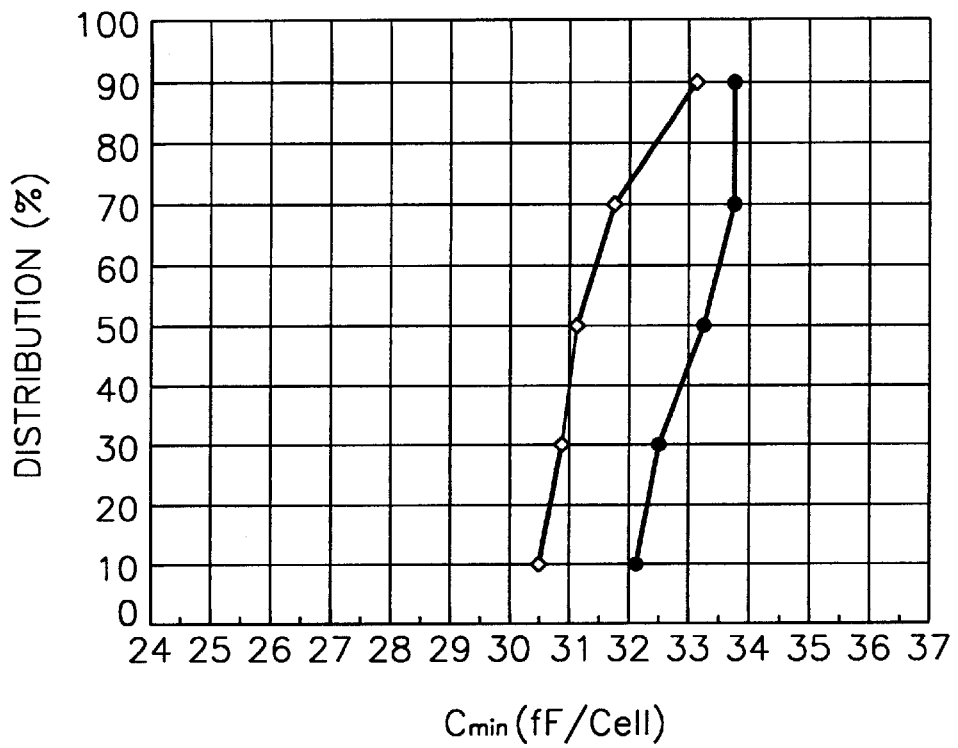
FIG. 22 is a graph that illustrates minimum capacitance ($C_{min}$) for HSG capacitors formed in accordance with conventional methods and methods according to the present invention.
Figure 23:
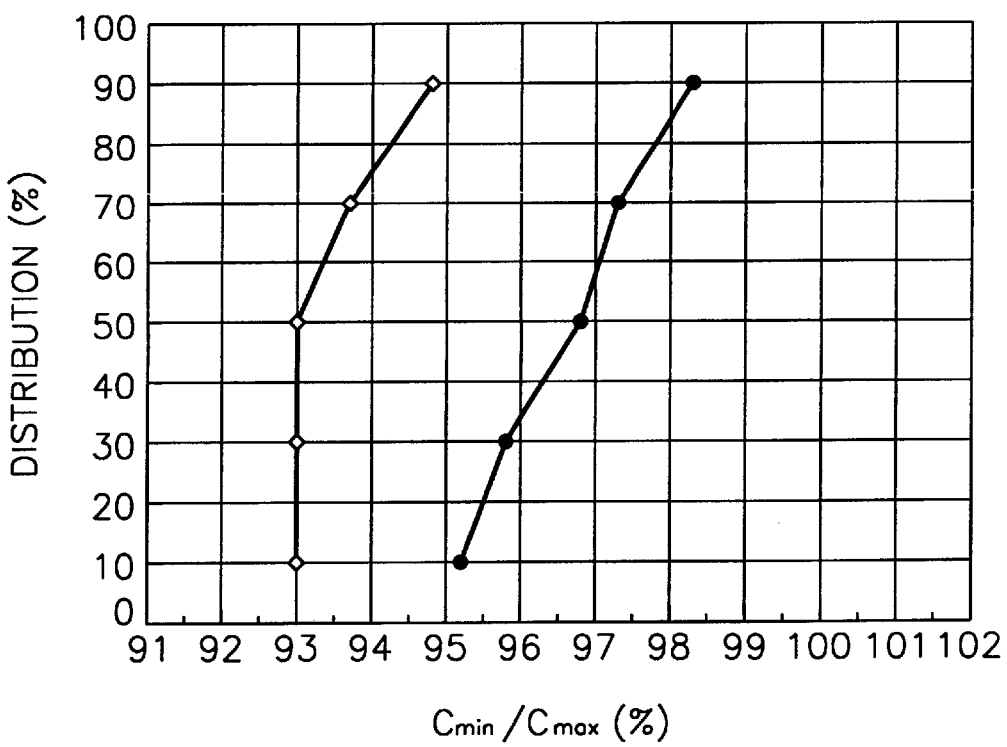
FIG. 23 is a graph that illustrates a ratio of minimum capacitance/maximum capacitance for HSG capacitors formed in accordance with conventional methods and methods according to the present invention.

In order to investigate the characteristics of capacitors according to the present invention, capacitance characteristics thereof are compared to those of a capacitor formed by a conventional method. FIGS. 22 and 23 show the results, wherein the capacitance characteristics of capacitors formed according to the present invention are indicated by "•" and those formed by a conventional method are indicated by "◇".

For this experimental example, the capacitor according to the present invention was prepared as shown in FIG. 7, by depositing amorphous silicon layers doped with different concentrations of impurities to a thickness of 250 Å, to form a U-shaped lower electrode, and then by growing HSGs on the inner surface of the lower electrode. Also, the capacitor formed by the conventional method was prepared by depositing a single amorphous silicon layer at a low concentration to a thickness of 500 Å to form a U-shaped lower electrode, and then by growing HSGs on the inner surface thereof. Also, a dielectric film was formed by stacking a silicon nitride layer and a silicon oxide layer, and an impurity doped polysilicon layer was used to form an upper electrode. In detail, the processing conditions were as follows:

1) Step of deposing amorphous silicon—using low-pressure chemical vapor deposition in a batch type chamber:

Pressure in chamber: 0.5 Torr

Temperature in chamber: 520° C.

Source gas: $SiH_4$, $PH_3$ (silane family gases including monosilane, disilane, trisilane and dichlorosilane may be used)

Concentration of impurities, and deposition thickness:

(1) Present invention
frame layer; $4.6 \times 10^{20}$ atoms/cm$^3$, 250 Å
inner layer grown into HSGs: $0.8 \times 10^{20}$ atoms/cm$^3$, 250 Å

(2) Prior art
$-2.0 \times 10^{20}$ atoms/cm$^3$, 500 Å

2) Step of seeding HSGs—in a single wafer type chamber

Pressure in chamber: less than $10^{-6}$ Torr

Heater temperature: 750° C. (actual temperature of substrate 590–600° C.)

Seeding gas: $Si_2H_6$

3) Step of growing HSGs—perform a thermal process for a predetermined period in the same chamber as used for the seeding, at the same pressure and temperature as those for the seeding, but without seeding gas.

The U-shaped HSG capacitors were formed by the method according to the present invention and the conventional method under the above conditions, and capacitances thereof ($C_{min}$, capacitance when a (−) voltage is applied to the capacitor) were measured. As shown in FIG. 22, the capacitance of capacitors formed in accordance with the present invention were higher than that of the capacitor formed by the conventional method by about 2 fF. This is because the impurities of a layer doped with a high concentration of impurities diffuse into a layer doped with a low concentration of impurities during the thermal process steps.

Also, capacitance $C_{max}$ (which is the capacitance when a (+) voltage is applied to the capacitor) of the capacitors formed by the method according to the present invention and the conventional method was measured, and a ratio of $C_{min}/C_{max}$ (the higher this ratio is, the better) was calculated. As shown in FIG. 23, the ratio of $C_{min}/C_{max}$ of the capacitor according to the present invention can be improved by at least about 4% compared to the capacitor manufactured by the conventional method. This is because $C_{min}$ of the capacitor according to the present invention was increased as shown in FIG. 22.

Figure 24:
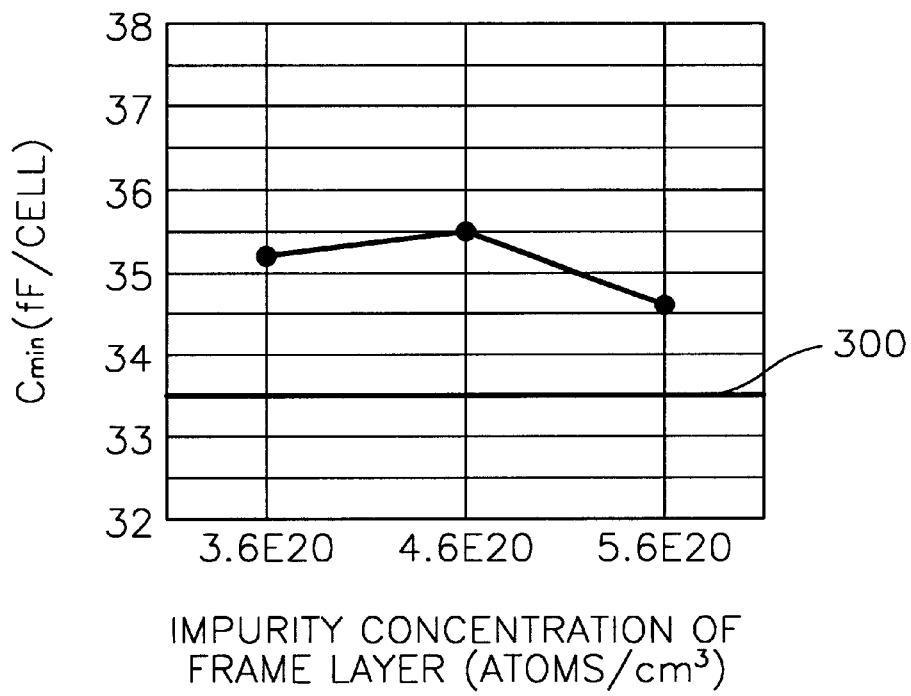
FIGS. 24 through 26 are graphs showing the capacitance $C_{min}$ and the capacitance ratio $C_{min}/C_{max}$ of the HSG capacitors formed according to the present invention, with respect to a variation of the concentration and thickness of a frame layer of the HSG capacitors.
Figure 25:
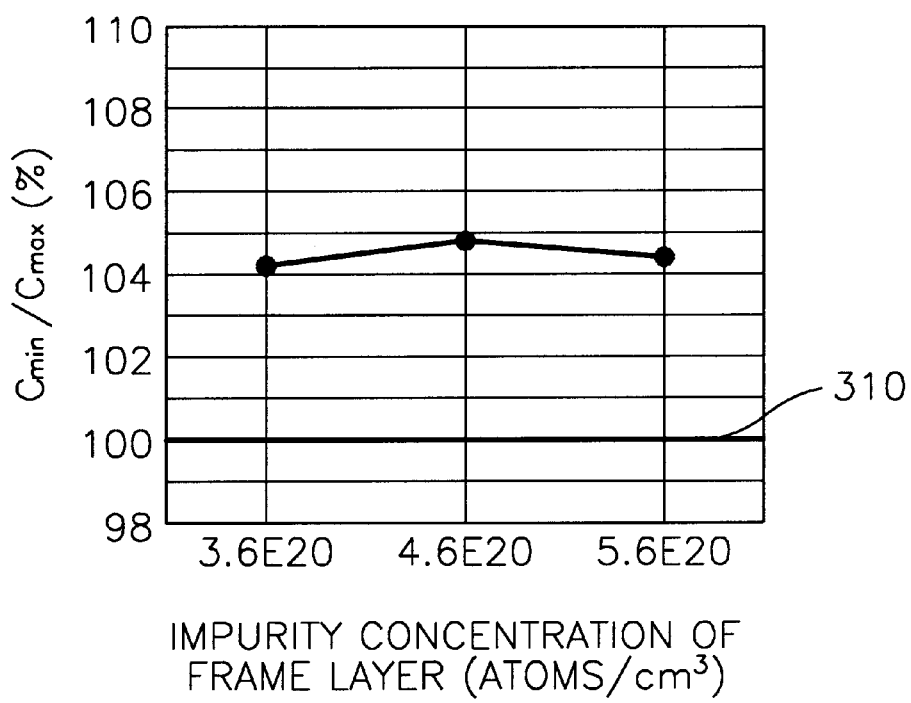
Figure 26:
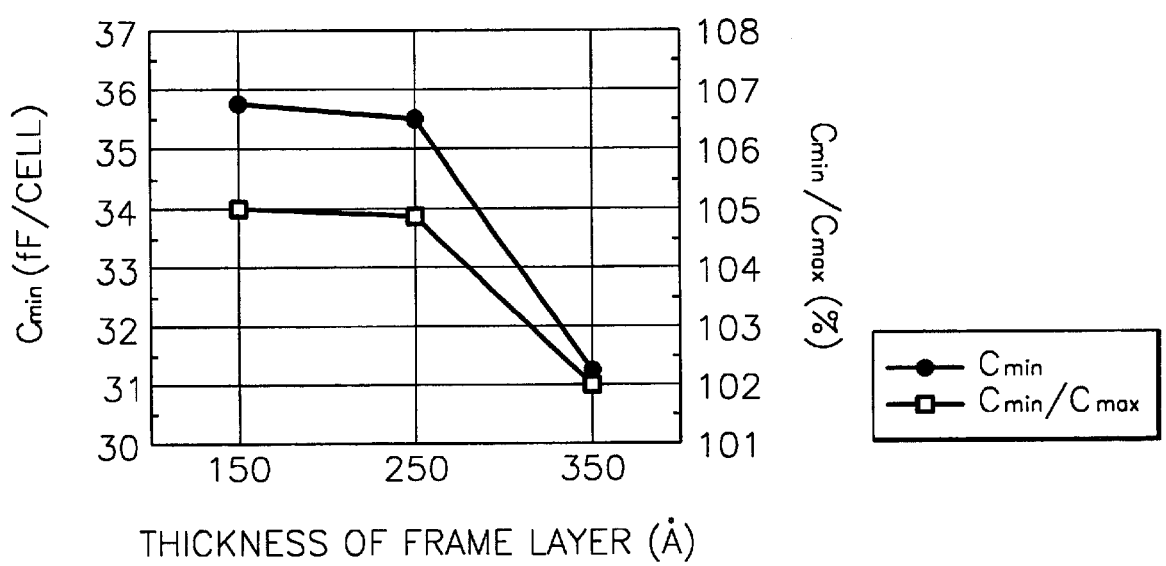

FIGS. 24 through 26 show the capacitance $C_{min}$ and the capacitance ratio $C_{min}/C_{max}$ of the capacitor formed in the first embodiment, with respect to a variation of the concentration and thickness of the frame layer 140 (see FIG. 5) doped with a high concentration of impurities, where as shown in FIG. 8A, two amorphous silicon layers are doped with different concentrations of impurities, HSGs are grown on the inner surface, and then the outer surface of the U-shaped lower electrode is exposed. In the present experimental example, the capacitor was formed under the same process and conditions as in the above experimental example described with reference to FIGS. 22 and 23, except that the impurity concentration and the thickness of the frame layer were varied. That is, the total thickness of the frame layer 140 (see FIG. 5) and the inner amorphous silicon layer 150 on which HSGs were to be grown (see FIG. 5) was 500 Å, and the impurity doping concentration of the HSG layer 150 was $0.8 \times 10^{20}$ atoms/cm$^3$. Also, the inner diameter of the U-shaped lower electrode was 700 nm.

FIGS. 24 and 25 are graphs showing the capacitance $C_{min}$ and the capacitance ratio $C_{min}/C_{max}$ measured respectively with a variation of the impurity concentration of the frame layer in the range of $3.6 \times 10^{20} \sim 5.6 \times 10^{20}$ atoms/cm$^3$. The thicknesses of the frame layer and the inner amorphous silicon layer were 250 Å. Referring to FIGS. 24 and 25, at the impurity concentration of 3.6E20 atoms/cm$^3$ or more in the frame layer, the capacitance $C_{min}$ and the capacitance ratio $C_{min}/C_{max}$ barely change with respect to the variation of the impurity concentration. Lines 300 and 310 drawn in FIGS. 24 and 25 represent the capacitance $C_{min}$ and the capacitance ratio $C_{min}/C_{max}$, respectively, of the capacitor formed by a conventional method, in which a single amorphous silicon layer is deposited to 500 Å with an impurity concentration of 2.0E20 atoms/cm$^3$, and HSGs are grown on the inner surface of a U-shaped lower electrode. Thus, it can be concluded that the capacitance characteristics of the capacitor according to the present invention are better than those of the conventional capacitor.

FIG. 26 is a graph showing the capacitance $C_{min}$ and the capacitance ratio $C_{min}/C_{max}$ with respect to variations of the thicknesses of a frame layer and inner amorphous silicon layer. In particular, the total thickness of the frame layer and the inner amorphous silicon layer was fixed at 500 Å, and the thickness of the frame layer was varied in the range of 150~350 Å while the thickness of the inner amorphous silicon layer was varied in the range of 350~150 Å. Also, the doping concentrations of the frame layer and the inner amorphous silicon layer were maintained at 4.6E20 atoms/cm$^3$ and 0.3E20 atoms/cm$^3$, respectively. As shown in FIG. 26, when the thickness of the frame layer was increased to 250 Å or more, the capacitance $C_{min}$ and the capacitance ratio $C_{min}/C_{max}$ sharply decreased. The reason for this is that the migration of silicon atoms for growth of HSGs was restricted as the frame layer, doped with a high impurity concentration, became thick and the inner amorphous silicon layer, doped with a low impurity concentration, became thin.

According to the present experimental example, in the case where the total thickness of the lower electrode is fixed at about 500 Å, the optimal doping concentration and thickness of the frame layer are about 4.6E20 atoms/cm$^3$ and 250 Å, respectively. However, such levels are optimal for the present experimental example, and the optimal doping concentration and thickness of the frame layer can very according to the overall size and other processing conditions.

As described above, in the HSG capacitor and the method of manufacturing the same according to the present invention, the lower electrode is formed by depositing at least two silicon layers with different impurity doping concentrations, and the growth of HSGs can be adjusted such that the size of HSGs formed on the inner surface of a U-shaped lower electrode or on the top of a stacked lower electrode is larger than that of HSGs formed on the outer surface of the U-shaped lower electrode or on the sides of the stacked lower electrode. Thus, the possibility of bridging between HSGs formed on the outer surfaces of the neighboring lower electrodes is suppressed.

Also, according to the present invention, by forming at least one amorphous silicon layer doped with a high impurity concentration, where silicon atoms barely migrate, uniform sizes of HSGs are grown everywhere within the wafer or wafer-to-wafer, although almost all silicon atoms grow into HSGs in an amorphous silicon layer doped with a low impurity concentration, resulting in uniform capacitance. Also, migration of silicon atoms of an amorphous silicon layer doped with a high concentration of impurities is reduced, so that a local decrease in thickness is suppressed, thus enhancing mechanical strength.

Also, during a subsequent thermal process, impurities are diffused from a layer doped with a high concentration of impurities into a layer doped with a low concentration of impurities, thereby increasing capacitance $C_{min}$ and enhancing the capacitance ratio $C_{min}/C_{max}$.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A hemispherical grain capacitor comprising:
   a U-shaped lower electrode, on the inner and outer surfaces of which hemispherical grains are grown;
   a dielectric film deposited on the U-shaped lower electrode; and
   an upper electrode formed on the dielectric film,
   wherein an average size of the hemispherical grains formed on the inner surface of the U-shaped lower electrode is larger than that of the hemispherical grains formed on the outer surface of the U-shaped lower electrode.

2. The hemispherical grain capacitor of claim 1, wherein an undercut exposing the base of the U-shaped lower electrode is formed, and the dielectric film and the upper electrode are formed beneath the exposed base of the lower electrode.

3. The hemispherical grain capacitor of claim 2, wherein hemispherical grains are formed on the exposed base of the lower electrode.

4. A hemispherical grain capacitor comprising:
   a stacked lower electrode, on the top surface and sides of which hemispherical grains are grown:
   a dielectric film deposited on the stacked lower electrode; and
   an upper electrode formed on the dielectric film,
   wherein an average size of the hemispherical grains formed on the sides of the stacked lower electrode is smaller than that of the hemispherical grains formed on the top surface of the stacked lower electrode.

5. The hemispherical grain capacitor of claim 4, wherein an undercut exposing the base of the stacked lower electrode is formed, and the dielectric film and the upper electrode are formed beneath the exposed base of the lower electrode.

6. The hemispherical grain capacitor of claim 5, wherein hemispherical grains are formed on the exposed base of the lower electrode.

7. A method of forming a hemispherical grain capacitor, comprising:
   depositing at least two amorphous silicon layers on a substrate with different impurity doping concentrations, to form a U-shaped lower electrode;
   inducing the migration of silicon atoms of the U-shaped lower electrode to grow hemispherical grains on at least a part of the surface of the lower electrode;
   depositing a dielectric film on the lower electrode on which the hemispherical grains have been grown; and
   forming an upper electrode on the dielectric film,
   wherein the doping concentration of one of the at least two amorphous silicon layers, which forms the inner surface of the U-shaped lower electrode, is lower than that of the other amorphous silicon layer which forms the outer surface of the U-shaped lower electrode.

8. The method of claim 7, wherein the U-shaped lower electrode comprises three amorphous silicon layers, and the doping concentration of the middle amorphous silicon layer is higher than that of other silicon layers.

9. The method of claim 7, wherein each of the at least two amorphous silicon layers has a constant impurity doping profile within the respective layers.

10. The method of claim 7, wherein the at least two amorphous silicon layers have a continuously varying impurity doping profile throughout the at least two amorphous silicon layers thereby actually forming a single layer of amorphous silicon.

11. The method of claim 7, wherein in the step of depositing the at least two amorphous silicon layers, the doping of impurities is simultaneously carried out with the deposition of the amorphous silicon layers.

12. The method of claim 7, wherein in the step of growing the hemispherical grains, the hemispherical grains are grown on only the inner surface of the U-shaped lower electrode.

13. The method of claim 7, wherein in the step of growing the hemispherical grains, the hemispherical grains are grown on the inner and outer surfaces of the U-shaped lower electrode.

14. The method of claim 7, further comprising forming an undercut exposing the base of the U-shaped lower electrode.

15. The method of claim 14, wherein in the step of growing the hemispherical grains, hemispherical grains are grown on the exposed base of the U-shaped lower electrode.

* * * * *